United States Patent
Coronel et al.

(10) Patent No.: US 6,363,294 B1
(45) Date of Patent: Mar. 26, 2002

(54) METHOD AND SYSTEM FOR SEMICONDUCTOR WAFER FABRICATION PROCESS REAL-TIME IN-SITU INTERACTIVE SUPERVISION

(75) Inventors: Philippe Coronel, Massy; Jean Canteloup, deceased, late of Montlhery, by Stephane Canteloup, of La Trinite-sur-mer, Nathalie Canteloup, of Montlhery, Marlene Marchand, of La Ville du Bois, executors; Renzo Maccagnan, Villabe; Jean-Phillippe Vassilakis, Leuville-sur-Orge, all of (FR)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/222,498

(22) Filed: Dec. 29, 1998

(30) Foreign Application Priority Data

Dec. 30, 1997 (EP) ............................................. 97480104

(51) Int. Cl.[7] ............................................. G06F 19/00
(52) U.S. Cl. ........................... 700/121; 700/117; 438/5; 438/800
(58) Field of Search ................................ 700/121, 117; 702/81; 714/48; 438/5, 800

(56) References Cited

U.S. PATENT DOCUMENTS

| | | | |
|---|---|---|---|
| 4,901,242 A | 2/1990 | Kotan | 700/108 |
| 5,210,041 A | 5/1993 | Kobayashi et al. | 438/7 |
| 5,483,636 A | 1/1996 | Saxena | 714/25 |
| 5,511,005 A | 4/1996 | Abbe et al. | 702/84 |
| 5,625,816 A | 4/1997 | Burdick et al. | 707/103 |
| 5,654,903 A * | 8/1997 | Reitman et al. | 702/81 |
| 5,787,190 A * | 7/1998 | Peng et al. | 382/145 |
| 5,859,964 A * | 1/1999 | Wang et al. | 714/48 |
| 6,090,632 A * | 7/2000 | Jeon et al. | 438/14 |
| 6,185,511 B1 * | 2/2001 | Steffan et al. | 702/81 |
| 6,192,291 B1 * | 2/2001 | Kwon | 700/121 |

FOREIGN PATENT DOCUMENTS

| | | |
|---|---|---|
| EP | 072004 A1 | 12/1995 |
| GB | 2126374 A | 3/1984 |

OTHER PUBLICATIONS

Supervisory Run–to–Run Control of Polysilicon Gate Etch Using In Situ Ellipsometry, Stephanie Watts and Jerry A. Stefani, Member, IEEE, IEEE Transactions on Semiconductor Manufacutirng, 7 (1994) May, No.2, New York, US.

Diagnostic Monitoring of Photoresist Ashing, Jerry A. Stefani, Lee M. Loewenstein, and Michael Sullivan, IEEE/SEMI Int'l Semiconductor Manufacturing Science Symposium, Jul. 19, 1993.

* cited by examiner

Primary Examiner—William Grant
Assistant Examiner—Ronald D Hartman, Jr.
(74) Attorney, Agent, or Firm—Robert A. Walsh

(57) ABSTRACT

Method and system for real-time in-situ interactive supervision of a step performed in a tool during semiconductor wafer fabrication process. The system includes a tool and the computer attached thereto, an end point detection controller, a database and a supervisor to supervise the whole wafer processing for that step. The controller is used to monitor a key process parameter of the step and is adapted to perform in-situ measurements. The database contains the evolution of said process parameter in normal operating conditions and in all the identified deviations. It further contains the history of the wafer until this step and a reference to the batch and process names for this step and the wafer identification number. At the end of the step, the important process parameters and any alert code are stored in the database to up-date the wafer history. This technique allows a total clusterized wafer fabrication process and prevents wafer rejection.

7 Claims, 14 Drawing Sheets

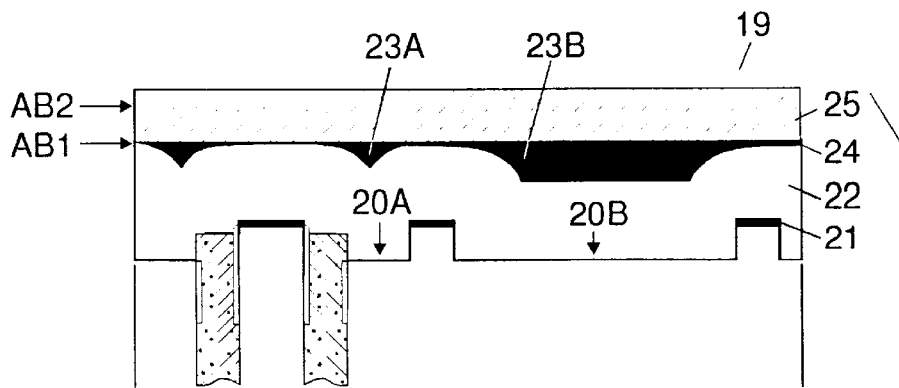
FIG.3A
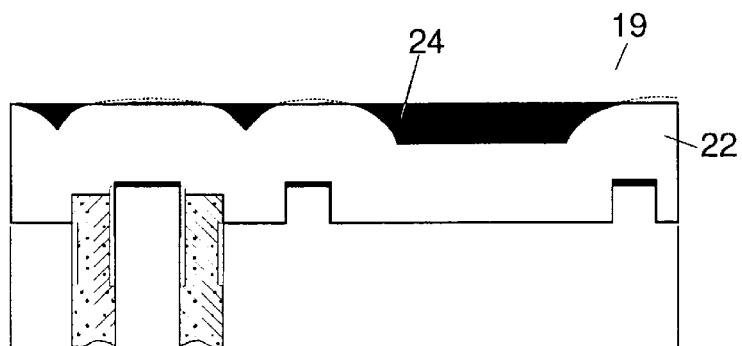
FIG.3B
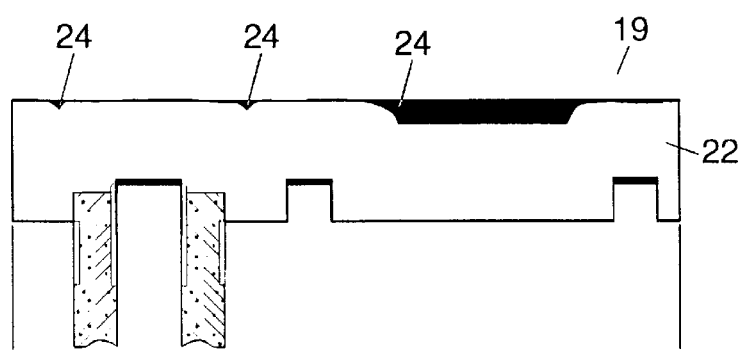
FIG.3C
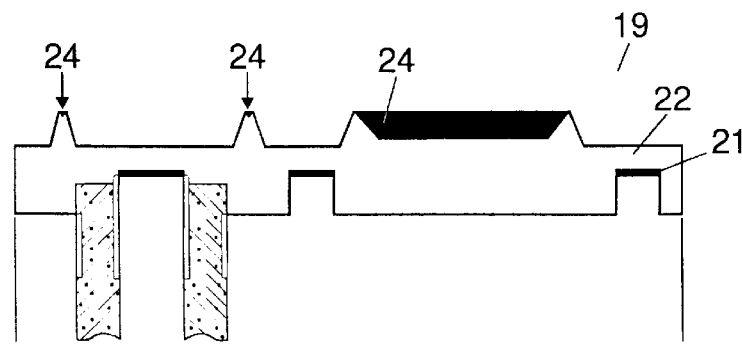
FIG.3D
FIG.3 PRIOR ART

METHOD AND SYSTEM FOR SEMICONDUCTOR WAFER FABRICATION PROCESS REAL-TIME IN-SITU INTERACTIVE SUPERVISION

FIELD OF INVENTION

The present invention relates generally to the manufacture of semiconductor integrated circuits and more particularly to a method and a system for real-time in-situ interactive supervision of the semiconductor wafer fabrication process. In a dedicated tool controlled by a computer, a method is developed which includes the steps of monitoring in real-time in-situ a plurality of process parameters in parallel by an end-point controller. Analysis rules are developed to perform a comparison and associated rejection criteria are coded in the form of algorithms and likewise stored in a database. If a process deviation is detected, an alert code is flagged to signal an alarm and the adequate action is immediately taken and these data stored in the database may be used to up-date the operating conditions of a step before it takes place.

BACKGROUND OF THE INVENTION

Due to the constant integration density increase, the fabrication processes that are used to date in the manufacture of semiconductor wafers for the production of integrated circuits (ICs) have to be very accurately controlled. For this reason, processing tools which are required to that end, are becoming more and more complex. A processing tool can include a plurality of chambers, and in turn, each chamber can run a great number of processing steps. For money saving and high throughputs, the wafer is generally processed in sequence via said plurality of chambers of the tool under computer control. The selection of the chamber depends on a number of factors such as: availability, contamination level, specialization, . . . etc.

New methods for tool and process characterization such as in-situ contamination monitoring, measurements, gas analysis and the like, are now of common use in the semiconductor industry. All these characterization techniques produce huge quantity of data of various types. In particular such data include the physical process parameters such as: gas flows, pressures, RF powers, temperatures, and the like, that are permanently under computer control during a determined step. Other data include results provided by controllers (e.g. etch rates) which continuously monitor the process and by measurement units.

FIG. 1 schematically shows a conventional system of the prior art referenced 10 that implements a typical process flow for processing semiconductor wafers. The description which follows will be made by reference to a multi-chamber RIE tool such as the AME 5000 manufactured by Applied Materials, Santa Clara, Calif., USA, that is adapted to perform a sequence of steps for etching different materials at the surface of the wafer. However, other tools such as deposition equipments and the like may be envisioned as well. Now turning to FIG. 1, system 10 is thus comprised of such a RIE etching tool 11 with a tool computer 12 associated thereto. As apparent from FIG. 1, tool 11 is only comprised of two chambers 11-1 and 11-2 for sake of simplicity, but in reality, it must be understood that it may have more, for instance, up to six independent chambers. Still for sake of simplicity, we will assume that each chamber performs the same sequence of processing steps, labelled A, B, . . . , I, . . . , X. A data bus referenced 13 provides the electrical connection between the tool chambers and the computer 12 for data flow exchange therebetween.

At initialization, computer 12 down-loads the physical process parameters of step A into chamber 11-1 or 11-2 as appropriate. Typical physical process parameters are gas flows, pressures, RF powers, temperatures and the like. Then, step A is performed and is generally stopped after a fixed time. This procedure applies for the other steps B, C, . . . X, whenever necessary. During these steps, computer 12 checks the different physical process parameters via data bus 12 for process control and only stops the current process if one of them passes beyond a predefined limit. A stop generally occurs after a serious hardware failure such as a RF power shut-down or a gas flow missing.

FIG. 2 describes an improved version of the system depicted in FIG. 1 now referenced 10', the same elements bearing the same references. For sake of illustration, only three (A to C) and one (A) processing steps are performed in chambers 11-1 and 11-2 respectively. In addition to the tool 11, the computer 12 and the data bus 13 connected therebetween, the improved system 10' includes additional equipments associated to each tool chamber. As apparent in FIG. 2, two etch end-point detection (EPD) controllers 14-1 and 14-2 are provided with optical fibers 15-1 and 15-2 to view the plasma inside chambers 11-1 and 11-2 respectively. The role of these EPD controllers is only to perform optical/interferometric measurements. An adequate EPD controller that can be used in system 10' is the DIGISEM or DIGIT-WIN sold by SOFIE Instr., Arpajon, FRANCE. However, in the present application, "EPD" denotes either "etch end point detection" or more generally "end point detection", for instance, if a deposition process is used instead of an etch process. Likewise, two control devices 16-1 and 16-2, typically particle counters, gas detectors, mass spectrometers and the like are associated to chambers 11-1 and 11-2 respectively. The nature of these control devices depends on the function: etching, deposition, . . . of the tool in consideration. Control devices are used by the operators for visual inspection of the on-going process, so that they may stop it in case of need, for instance, if a contamination in excess is detected by a particle counter. Finally, two measurement units 17-1 and 17-2 are necessary for intermediate and post-processing measurements to determine whether or not the wafer is still within the specifications at the output of each chamber. Note that, in some cases, measurement units 17-1 and 17-2 can designate a single and same unit 17. As apparent in FIG. 2, these measurement are respectively performed at the output of chambers 11-1 and 11-2. Measurement units and control devices are generally provided with a local database to record the main events for subsequent review by the operators at the end of the process. Data bus 18 provides the necessary electrical connection between the computer 12 and the EPD controllers 14-1 and 14-2 for an elementary data exchange. As a matter of fact, the role of EPD controllers is only to signal that the etch end point has been detected or if not, that the processing step hag reached the maximum allowed time for that determined step.

The operation of system 10' is relatively simple. Let us assume that for sake of simplicity, that (1) only three steps labelled A to C are performed in the first chamber 11-1 with only two steps (A and C) monitored by EPD controller 14-1 and (2) only one step (A) is performed in chamber 11-2. First, computer 12 down-loads physical process parameters to chamber 11-1 via data bus 13 the way described above, and in the meantime, the identification number of the algorithm to be used in step A is sent to EPD controller 14-1 via bus 18. Starting step A in chamber 11-1 also starts the EPD controller 14-1 scanning of the selected etch end point parameter, typically a specific radiation wavelength that is emitted by a determined layer at the surface of the wafer. A surge in the signal representing this emission indicates that the end point has been reached. However, other parameters can be used as well. The signal transmitted via optic fiber 15-1 is processed in EPD controller 14-1 to detect the etch end point. In that case, a signal is emitted by EPD controller 14-1 via data bus 18 to inform computer 12 that the etch end point has been reached and that step A must be stopped. In the contrary, EPD controller 14-1 informs computer 12 that the maximum allowed time has been reached. Next, step B is initiated. The duration of this step is not monitored by EPD controller 14-1, so that it is therefore determined by a time fixed by the user. Let us assume that step C is performed the same way as step A, i.e. it is also monitored by EPD controller 14-1. Once step C has been completed, the wafer is sent to the measurement unit 17-1 to check whether or not its complies with the specifications. Only good wafers are loaded in chamber 11-2 to continue processing. Once step A is achieved in chamber 11-2, a new measurement step is performed in measurement unit 17-2. It is important to notice, that none of these steps A to C performed in the first chamber interferes with another, nor with the step performed in the second chamber. In other words, all these steps are sequentially performed without any influence of a previous step on the following step. As mentioned above, during these steps, computer 12 checks all different physical process parameters and stops current process only one of them passes beyond a predefined limit. Optionally, a summary of these physical process parameters can be uploaded in the database of computer 12 for subsequent analysis. However, the real status of the wafer after each processing step is totally unknown for the computer.

A better understanding of the complex interactions between the system 101 of FIG. 2 and the wafer fabrication process itself will be best understood by the following description made by reference to FIGS. 3 to 5 when the system 10' is used to perform the so-called "AB ETCH"/"AB STRIP" in the course of the trench formation process in DRAM chips. The "AB ETCH" is comprised of three etching steps (labelled A, B and C) performed in sequence in the same chamber, i.e. 11-1 of the etch tool 11. The "AB ETCH" is followed by the "AB STRIP", a single step (labelled A) in chamber 11-2 that aims to remove the photoresist material remaining after these three etching steps. The "AB ETCH/AB STRIP" process has been chosen because it is consistent with the above description made by reference to FIG. 2 but also because it is a good introduction to the method and system of the present invention. Please refer to European Pat. appl. No 756,318 for more details. The "AB ETCH" process will be first briefly summarized hereinbelow.

Let us consider FIG. 3 which is comprised of FIGS. 3A to 3D. Now turning to FIG. 3A, there is shown a portion of a semiconductor wafer illustrating a structure referenced 19 at the initial stage prior to the "AB ETCH" process properly said. Structure 19 to be etched includes a silicon substrate in which shallow trenches 20A and 20B have been selectively formed using an in-situ Si3N4 mask layer 21. These trenches are filled with TEOS SiO2 material by the deposition of a conformal layer 22. At this stage of the fabrication process, small and wide depressions referenced 23A and 23B are formed in layer 22 above trenches 20A and 20B respectively as shown in FIG. 3A. Planarization of structure 19 then requires the successive deposition of two photoresist layers. A photoresist layer (AB1) 24 with a thickness of 830 nm is first deposited onto the structure 22, then exposed, baked and developed as standard to leave a patterned layer referred to as AB1 mask still referenced 24. In essence, the aim of this mask 24 is to fill the wide depressions 23B and a determined amount of small depressions such as 23A. Next, a second 830 nm thick layer (AB2) 25 of the same photoresist is applied over layer 24, then baked. After this second step, we can consider that the wafer surface is coarsely planar.

Now, the coarsely planarized surface of the FIG. 3A structure will be transferred to the TEOS SiO2 layer 22 to produce a thinner but substantially planar layer of TEOS SiO2 all over the silicon wafer according to the "AB ETCH" process. The "AB ETCH" process is completed in three different steps labelled A to C. All these steps are achieved in a single chamber of the AME 5000 plasma etcher as mentioned above.

According to the first step, referred to as step A, the top resist layer 25 is etched until the surface of the TEOS SiO2 layer 22 (at mount locations) is reached. By means of an adequate algorithm, EPD controller 14-1 is used to detect the AB2 layer 25/TEOS SiO2 layer 22 interface, by detecting a SiO ray having a wavelength of 230.0 nanometers.

FIG. 4 shows the plot displayed on EPD controller 14-1 screen at the end of step A. Curves 26 and 27 respectively show signal S1 which illustrates the 230.0 nm SiO intensity as a function of time during this first step A and its derivative signal S'1. On the other hand, curves 28 and 29 respectively show signal S2 which illustrates the intensity of a CO ray having a wavelength of 483 nm and its derivative signal S'2. Signal S'2 allows to determine the etch rate of AB2 layer 25 as standard. Signals S1 and S2 result from optical measurements. Signals depicted in FIG. 4 are illustrative of a structure 19 without any defect and an etch process perfectly conducted. The surge that can be noticed in signal S'1 (curve 27) is used as the etch end point criteria for step A. A short over-etching is then conducted to terminate this step. At this stage of the process, the structure 19 is shown in FIG. 3B.

Now, the second step B is performed to remove a given amount (about 160 nm) of the AB1 photoresist and TEOS SiO2 layers with a different non selective etching chemistry. The resulting structure is shown in FIG. 3C.

In the third and last step C, the TEOS SiO2 layer 22 is etched using the AB1 resist layer as an in-situ mask. To that end, controller 14-1 now performs an interferometric measurement of the type described in European Pat. No 735,565 to Auda et al jointly assigned to IBM Corp. and SOFIE Inst. to determine the etch end-point. Briefly said, a light beam generated by a mercury lamp is applied to the wafer. According to that reference, two different wave-lengths are used to control the amount of TEOS SiO2 layer 22 etched from a given starting point so called "RATE TIME".

FIG. 5 shows the plot displayed on EPD controller 14-1 screen at the end of step C. Curves 30 and 31 respectively illustrate signals S3 and S4 that are representative of the 404.7 nm and 435.8 nm Hg radiation intensity as a function of time. Curves 32 and 33 illustrate their respective derivative signals S'3 and S'4. Both wavelengths can be used for etch end point determination. The typical shape of curves 30 to 33 are still illustrative of a structure 19 without any defect and of an etch process correctly performed. The sine-shaped curves 30 and 31 allow an easy determination of the etch rates at step C. The reader may wish to consider the Auda et al reference for more details related to this particular measurement technique. At the end of the "AB ETCH" process, the targeted TEOS SiO2 thickness remains over the Si3N4 mask layer 21. The resulting structure is shown in FIG. 3D.

The interactions between the different constituting parts of system 10' and the "AB ETCH/AB STRIP" process therefore read as follows. First, the wafer to be etched is introduced in chamber 11-1 of the AME 5000 plasma etcher tool 11. Then, the etch process of step A starts, so does EPD controller 14-1. When etch end point is found, step A is stopped. Then, step B is initiated. Once step B is finished after a fixed period of time, step C is completed as described by reference to step A. Finally, after completion of the whole sequence of steps A to C, the wafer is sent (may be true for some sample wafers only) to measurement unit 17-1 in order to determine whether the remaining TEOS layer 22 thickness is within specifications or not. If remaining TEOS layer 22 is too thin, the wafer is rejected. If remaining TEOS layer 22 is too thick, the wafer is sent back to the chamber 11-1 for rework. Reworked wafers are measured again. Good wafers are loaded in a cassette and then sent to chamber 11-2 for stripping the remaining of photoresist AB1 layer 24 according to step A of the "AB STRIP" process. After the "AB STRIP" process has been completed, the wafer is sent to measurement unit 17-2 to check if this step has been satisfactorily performed.

The above step sequence for a correctly processed wafer may be schematically summarized as follows.

1) Unload wafer from cassette and load wafer in chamber 11-1.
2) Run the three steps A to C of the "AB ETCH" process.
3) Measure the remaining TEOS SiO2 layer thickness in measurement unit 17-1. Dismiss bad wafer for rejection or rework.
4) Load wafer in chamber 11-2.
5) Run the single step A of the "AB STRIP" process.
6) Unload wafer from tool and load wafer in cassette.
6) Perform post-processing check in measurement unit 17-2. Dismiss bad wafer for rejection or rework.
7) Go to the next process.

The intermediate steps of loading/unloading the wafer into/from the cassette have not been mentioned for sake of simplicity.

The process flow showing the different processing/measurements steps conducted in their respective tools/equipments is shown in FIG. 6. As apparent from FIG. 6, because the TEOS SiO2 layer thickness needs to be checked in measurement unit 17-1 before it is sent to chamber 11-2, the "AB ETCH" process cannot be clusterized, i.e. a direct transfer between chambers 11-1 and 11-2 is impossible. In others words, this process cannot be qualified as "in-situ" because the wafer leaves the vacuum of tool 11 for that measurement step. Finally, this sequence of steps terminates by another mandatory measurement step in measuring unit 17-2.

In addition, using EPD controller 14-1 to control steps A and C does no guarantee a correct "AB ETCH" process. Some serious problems that often occur at this stage of the fabrication process may lead to reject a number of wafers. One can distinguish among these problems, according to a coarse classification, those related to misprocessing errors, process drifts and tool failures. A typical mis-processing error consists to have AB1 or AB2 layer (or both) missing. For instance, if the AB2 layer 25 is missing, the EPD controller 14-1 will wait the occurrence of a transition in the S'1 signal (related to the 230 nm SiO ray) which will never happen. As a consequence, step A will stop at the end of the maximum allowed time. In this case, the wafer must be rejected because during this step, there has been performed an undesired over-etching of the AB1 mask layer 24 and of the TEOS SiO2 layer 22. The wafer is definitely damaged and is no longer reworkable. The other most commonly observed misprocessing errors are: a non-exposure of the AB1 photoresist layer 24, the TEOS SiO2 layer 22 thickness out of specifications or the TEOS SiO2 layer simply missing. A deposition of polymers on the view-port surface of the AME 5000 plasma etcher will produce process drifts that could be detrimental to keep the wafer within specifications. Finally, an electrical misfunction on the buses or a RF shut-down are typical examples of tool failures.

For these reasons, the "AB ETCH" process needs to be constantly under human control as it is the only way to react if a problem occurs. The operator must periodically adjust parameters in the course of the process depending on its evolution, making thereby very difficult any automation attempt. Moreover, because there is no possibility to intervene during the process, a problem is only detected when a wafer is extracted from a chamber, so that it is too late to save the wafer which is often no longer reworkable. As a matter of fact, with the FIG. 2 system, about 5% of the wafers are rejected at the end of the "AB ETCH" process. Finally, it has also to be noticed that the "AB ETCH" process is slow because the measurement step performed in unit 17-1 necessitates a wafer loading/unloading operation in the cassette before a transfer between the two chambers takes place.

In summary, none of the system configurations shown in FIGS. 1 and 2 is able to react in real-time in-line to any of the above mentioned problems during the current processing step: wafer misprocessing, process drifts, and tool failures to immediately undertake the right corrective action. Moreover, none of these systems is able to take profit of the wafer history (i.e. all the events that occurred to the wafer prior to the current step) to change a process parameter during the current step or in a subsequent step. Moreover, these system configurations result in non automated tools because no clusterization is possible, so that the totality of the wafer processing cannot be performed in-situ in a multi-chamber tool. Mandatory intermediate and post-processing measurement steps slacken the process flow. Consequently, it would be highly desirable to develop a method and a system that would get rid of all these drawbacks.

SUMMARY OF THE PRESENT INVENTION

It is therefore a primary object of the present invention to provide a method and a system for semiconductor wafer fabrication process real-time in-situ interactive supervision.

It is another object of the present invention to provide a method and a system for semiconductor wafer fabrication process real-time in-situ interactive supervision that get rid of misprocessing errors, process drifts and tool failures by real-time detection thereof during wafer processing.

It is another object of the present invention to provide a method and a system for semiconductor wafer fabrication process real-time in-situ interactive supervision that significantly reduce the wafer rejection rate for increased manufacturing yields by stopping the processing or by-passing the next steps while the wafer is still reworkable.

It is another object of the present invention to provide a method and a system for semiconductor wafer fabrication process real-time in-situ interactive supervision that significantly reduce the wafer reworking.

It is another object of the present invention to provide a method and a system for semiconductor wafer fabrication process real-time in-situ interactive supervision that drastically reduce processing costs and turn-around time.

It is another object of the present invention to provide a method and a system for semiconductor wafer fabrication process real-time in-situ interactive supervision that obviate the necessity of having a permanent human control for better automation.

It is still another further object of the present invention to provide a method and a system for semiconductor wafer fabrication process real-time in-situ interactive supervision that eliminate all standard off-line measurements, including post-processing measurements to speed-up wafer processing and increase the daily going rate (DGR).

It is still another further object of the present invention to provide a method and a system for semiconductor wafer fabrication process real-time in-situ interactive supervision that allow to process only good wafers to avoid unnecessary processing time and wafer waste.

It is still another further object of the present invention to provide a method and a system for semiconductor wafer fabrication process real-time in-situ interactive supervision that allow a full clusterized (i.e. in-situ) process tracking all direct transfers, i.e. a direct transfer of the wafer from one chamber to another of the same tool without breaking the vacuum.

It is still another further object of the present invention to provide a method and a system for semiconductor wafer fabrication process real-time in-situ interactive supervision that incorporate in-situ measurements, the results of which are stored in a database to build the step/wafer history.

It is still another further object of the present invention to provide a method and a system for semiconductor wafer fabrication process real-time in-situ interactive supervision wherein the the key process parameters of a step are stored in a database at the end of the step to build the step/wafer history.

It is still another further object of the present invention to provide a method and a system for semiconductor wafer fabrication process real-time in-situ interactive supervision that take into account the previous step/wafer history during current wafer processing.

It is still another further object of the present invention to provide a method and a system for semiconductor wafer fabrication process real-time in-situ interactive supervision wherein data stored in the database are retrieved therefrom to up-date a process parameter before the step is started.

The accomplishment of these and other related objects is achieved by the supervisor and the supervision method of the present invention.

A preliminary but essential step of the method consists to establish an adequate database. First of all, for each step of the process, process engineers select a predetermined one or several process parameters that allow the system to monitor that step. The database first contains data relative to the evolution of selected process parameters during a certain step of the wafer fabrication process when this step takes place normally and the evolutions of these selected process parameters in case of identified deviations. These identified deviations are based on all the possible causes of wafer rejection based on experimental or empirical or other information known to the process engineers (hereinafter referred to as expert information). The process engineers define the set of analysis rules that permit to characterize these deviations and establish the corresponding rejection criteria. These rules are coded in the form of algorithms that are also stored in the database. These algorithms are thus adapted to subsequently monitor said selected process parameters during this step and detect any identified deviations. An alert code and an action, still based upon the expert information, are assigned to each deviation and coded the same way in the database. For instance, the current step can be stopped at any time in case of emergency or the next steps by-passed if so required by the alert code. The whole set of alert codes constitutes the alarms of this step in consideration. These operations are performed for each processing step of the wafer fabrication process and for each tool of the manufacturing line wherever possible.

Now, during a particular step of the wafer processing, the different monitoring equipments (EPD controllers, control devices, . . . ) that are selected to continuously monitor the selected process parameters for that step, generates data (e.g. electric signals) that are in real-time in-situ compared with the data stored in the database by said analysis algorithms. This analysis is performed in a dedicated unit referred to as a supervisor which receives data from said monitoring equipments and has an adequate connection with the database. If a deviation is detected, the supervisor emits the alert code to the computer controlling the process tool to flag an alarm and it takes an immediate and appropriate action; otherwise, the process is continued to its normal end.

At the end of that step, the key process parameters, the evolution of the selected process parameters during this step and the alert code (if any) are stored in the database. According to an important feature of the method and system of the present invention, the monitoring equipment is provided with a local measurement unit to perform in-situ measurements (e.g. a thickness) before the step takes place. The data related to these measurements are coded and also stored in the database. These data can be used either immediately or in a subsequent step to up-date some process parameters (e.g. an etch rate) of the step in consideration to modify the step current operating conditions. All the important data that are representative of the processing for that step constitutes "step report" of that step and is stored in the database. In the database, the wafer history is the sum of all the step reports for a particular process and a particular wafer. The wafer history is thus the essential element for this up-date. The sum of the "wafer history" of all the wafers of a batch constitutes the "batch history". In turn, the "batch history" of a plurality of batches can be exploited, in particular for statistics purposes, for instance for preventive/predictive maintenance. Among other advantages, one may note that only "good" wafers will be completely processed for higher throughputs and that a total clusterized in-situ wafer fabrication process is now possible.

The novel features believed to be characteristic of this invention are set forth in the appended claims. The invention itself, however, as well as these and other objects and advantages thereof, will be best understood by reference to the following detailed description of an illustrated preferred embodiment to be read in conjunction with the accompanying drawings.

BRIEF DESCRIPTION OF THE DRAWINGS

FIG. 3 which is comprised of FIGS. 3A to 3D shows a semiconductor structure undergoing the sequence of steps of the "AB ETCH" process;

DESCRIPTION OF A PREFERRED EMBODIMENT

The New System Including a Supervisor

Figure 1:
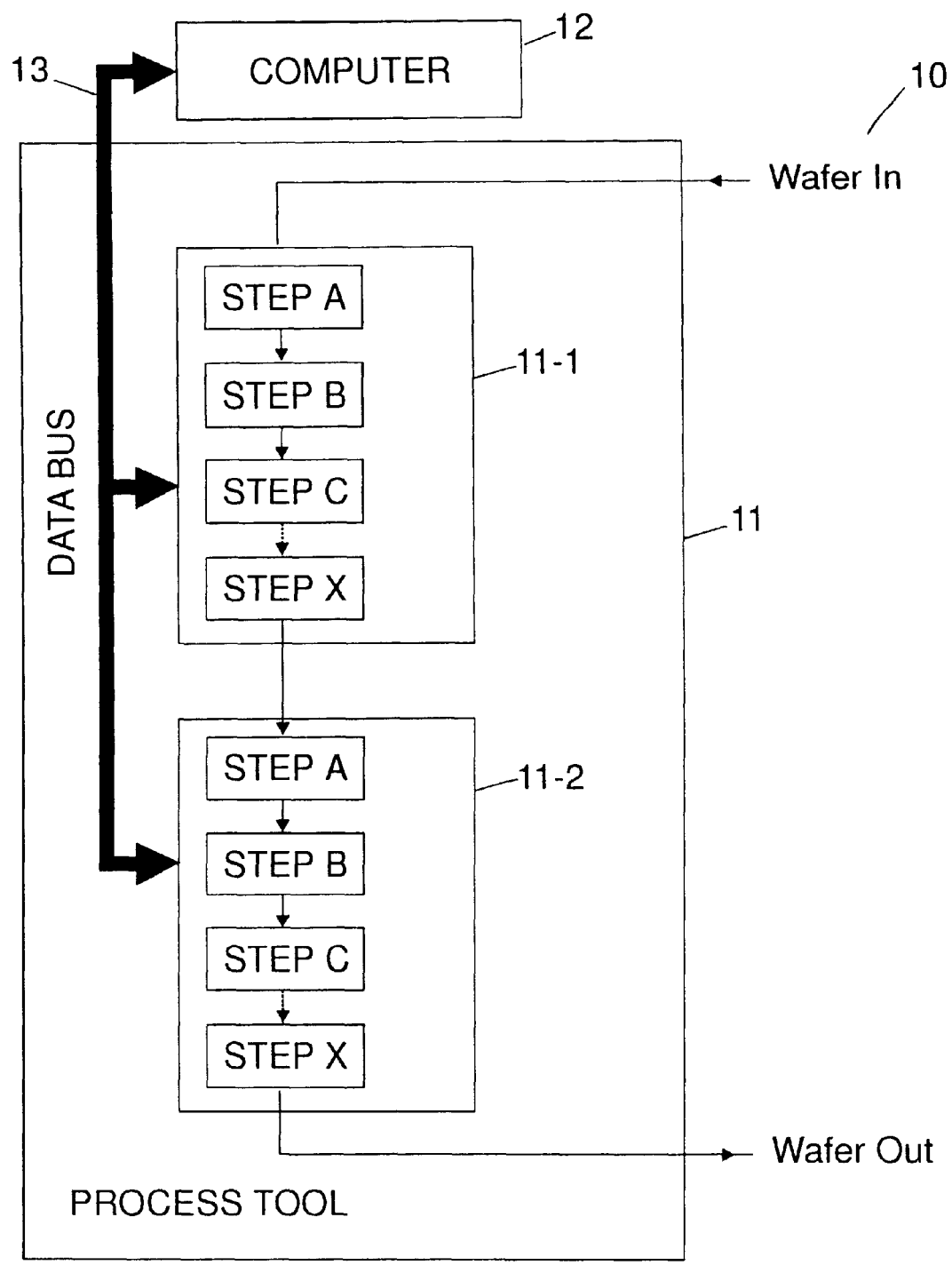
FIG. 1 shows a conventional system of the prior art for processing semiconductor wafers which is comprised of a two-chamber processing tool and a dedicated computer.
Figure 2:
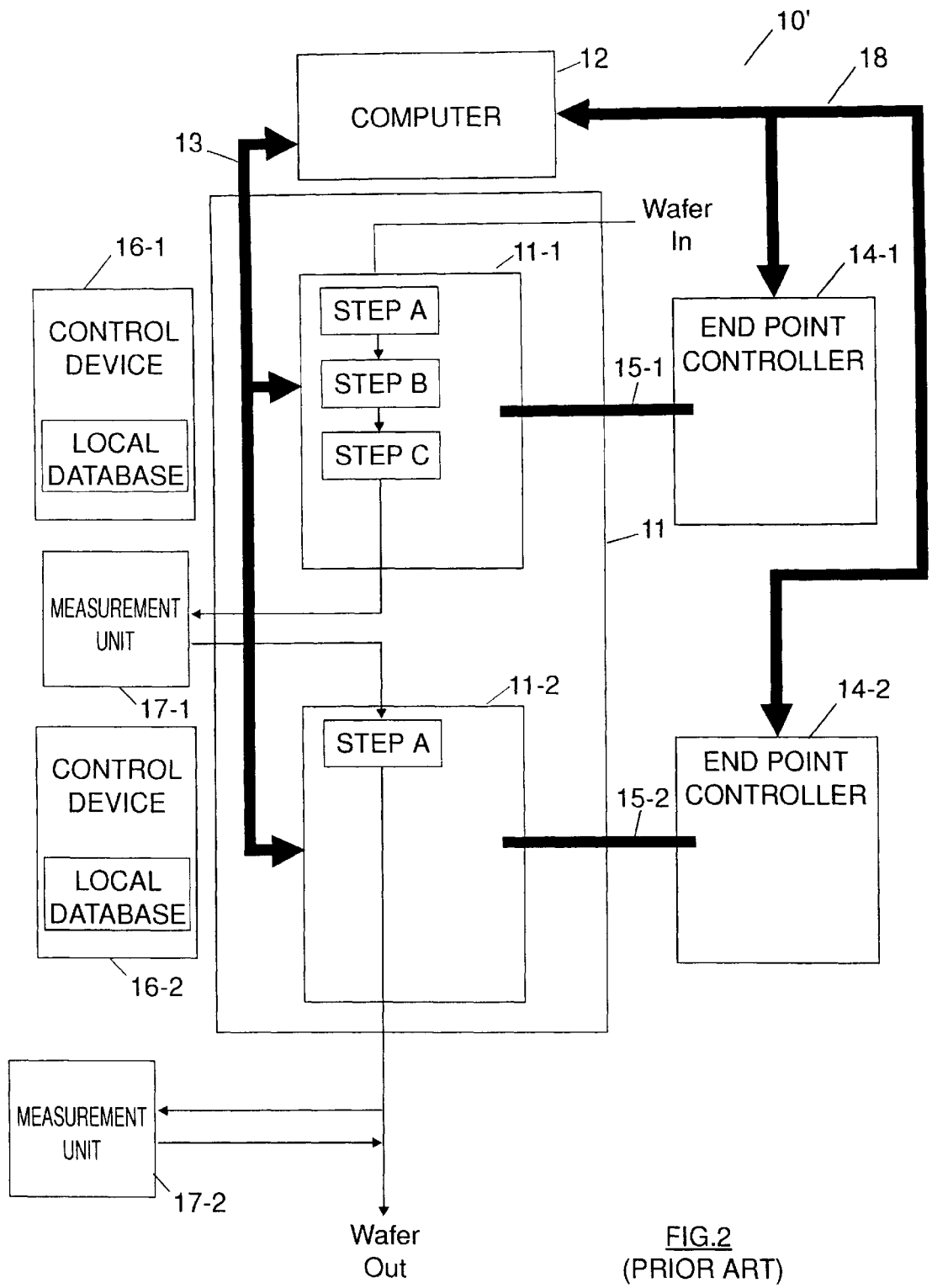
FIG. 2 shows an improved version, still conventional, of the FIG. 1 system which now includes different additional equipments (EPD controllers, control devices, . . . ) for a more efficient operation.
Figure 7:
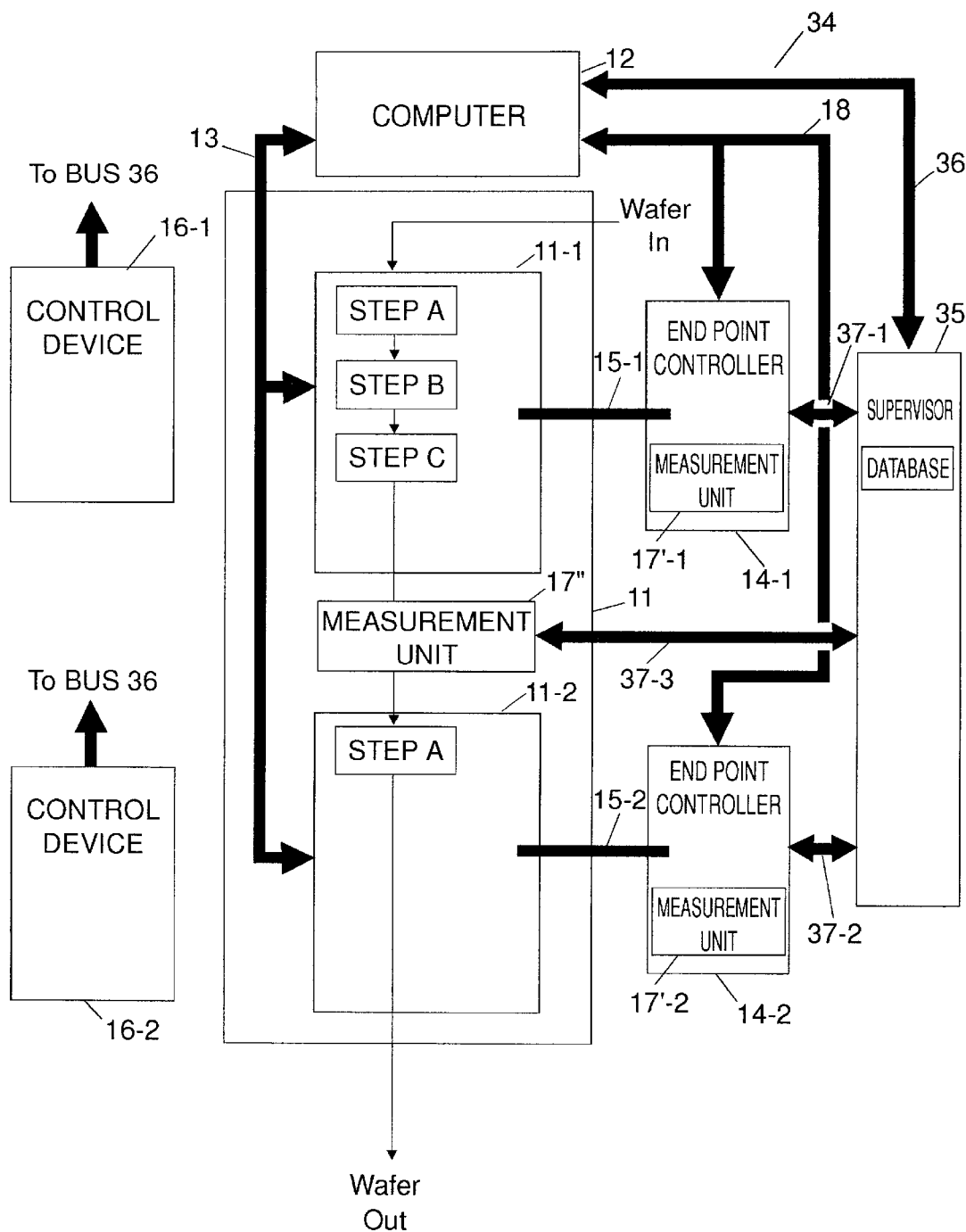
FIG. 7 shows the novel system according to the present invention wherein a supervisor is now added to the FIG. 2 system.

The new system referenced 34 is shown in FIG. 7. With regards to the improved system of the prior art depicted in FIG. 2, identical elements bear the same numeral. Turning to FIG. 7, the main differences lie in the addition of a dedicated unit referred to as the supervisor referenced 35 and at least one measurement unit internally mounted in an EPD controller and/or in tool 11. As a result, the external measurement units 17-1 and 17-2 that are no longer necessary are suppressed. According to an important feature of the present invention, a measurement unit referenced is internally mounted in an EPD controller (e.g. 14-1) or in the tool 11. In the first case, the measurement unit (e.g. 17'-1) performs an indirect measurement (e.g. an etch rate) through the tool view-port. On the contrary, in the latter case, the measurement unit (e.g. 17") performs a direct measurement (e.g. a thickness) on the wafer before it enters in any of the chambers composing the multi-chamber tool 11. Such a measurement unit is thus adapted to perform in-situ measurements on the wafer without a vacuum break. Measurement results are transmitted in real-time to supervisor 35. As far as thickness measurements are concerned, an adequate measurement unit is the DIGITOM, sold by SOFIE Instr., Arpajon, FRANCE. Because now a direct wafer transfer between chambers 11-1 and 11-2 is now possible, the tool 11 is considered to be fully clusterized, permitting thereby a so-called "in-situ" process. As apparent in FIG. 7, Supervisor 35 includes an internal database, however it should be understood that an external database could be used instead. Supervisor 35 is connected on the one hand to the computer 12 via a bidirectional data bus 36, typically a SECS II link, and on the other hand to EPD controllers 14-1, 14-2 and measurement unit 17" via bidirectional data bus 37-1, 37-2 and 37-3 respectively. However, some intelligence can be optionally installed in the EPD controllers if the supervisor has too many tasks to handle. This can be achieved by adding computing and storage capabilities in the EPD controller itself. An electronic card with a microprocessor and a few memory modules would be adequate in that respect. Optionally, control devices 16-1 and 16-2 can be connected to supervisor 35 via data bus 36, so that the supervisor 35 is also able to follow the process evolution as viewed by said control devices and not only by EPD controllers. The supervisor 35 has thus both computing and data storage capabilities. It is important to remark that computer 12 has the role of controlling the physical process parameters of tool 11 during the wafer processing while supervisor 35 is mainly interested by what happens to the wafer itself. This is the reason why it is connected through a data bus network to the EPD controllers (and thus to the measurement units enclosed therein), to measurement unit 17", and finally to the control devices whenever necessary.

The Novel Method of Supervision

Setting-up the "Alarm" Component of a Database

The method of the present invention first requires the preliminary step of creating a database containing "alarm" related data. For each step, the process parameters that are determining for the monitoring of this step are selected. They are monitored to establish the set of correct process data, corresponding to the normal situation, the evolution of which will be used as the reference for the analysis to be subsequently performed according to the method of the present invention. Then, for each potential cause of wafer rejection based on expert information, the same process parameters (or a few of them, those that are the most adapted to that particular deviation) are monitored to understand their drifts with respect to the reference evolution mentioned above. These deviations are based on all the possible causes of wafer rejection identified so far. All the data so collected which are representative of the normal situation and of the identified abnormal situations for this step are stored in the database of supervisor 35. In turn, these drifts are analyzed by the process engineers who then define a set of rules, referred to as the analysis rules, wherein the rejection criteria which characterize each particular deviation with respect to the normal process are defined. These analysis rules are formulated in the form of algorithms and likewise stored in the database. Finally, to each identified deviation corresponds an alert code and an action defined by the expert information. The alert codes may have different levels of priorities. On the other hand, the actions to be undertaken may be very different depending upon the seriousness of the deviation. The data related to the alert codes are also stored in the database. The above procedure is repeated for every step until the last step of the process in consideration is performed. The database which incorporates all these alarm related data is the first component of a larger database referred to as the database.

The few following examples will illustrate this preliminary step of creating such a database "alarm" component. For consistency with the introductory part of this application, they all relate to three steps of the "AB ETCH" process, so that they will be described by reference to structure 19 shown in FIG. 3.

EXAMPLE I

Figure 4:
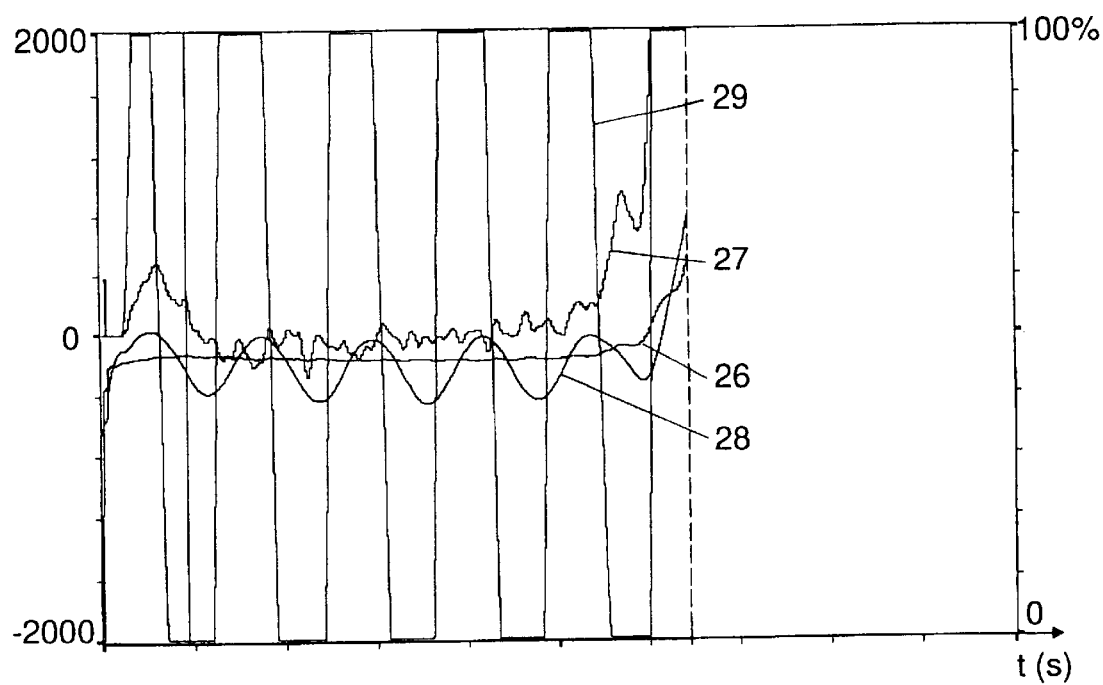
FIG. 4 shows the plot of signals displayed by an EPD controller monitoring step A of the "AB ETCH" process in a plasma etcher chamber when the structure is without defect and when the etch process of step A is performed correctly.
Figure 5:
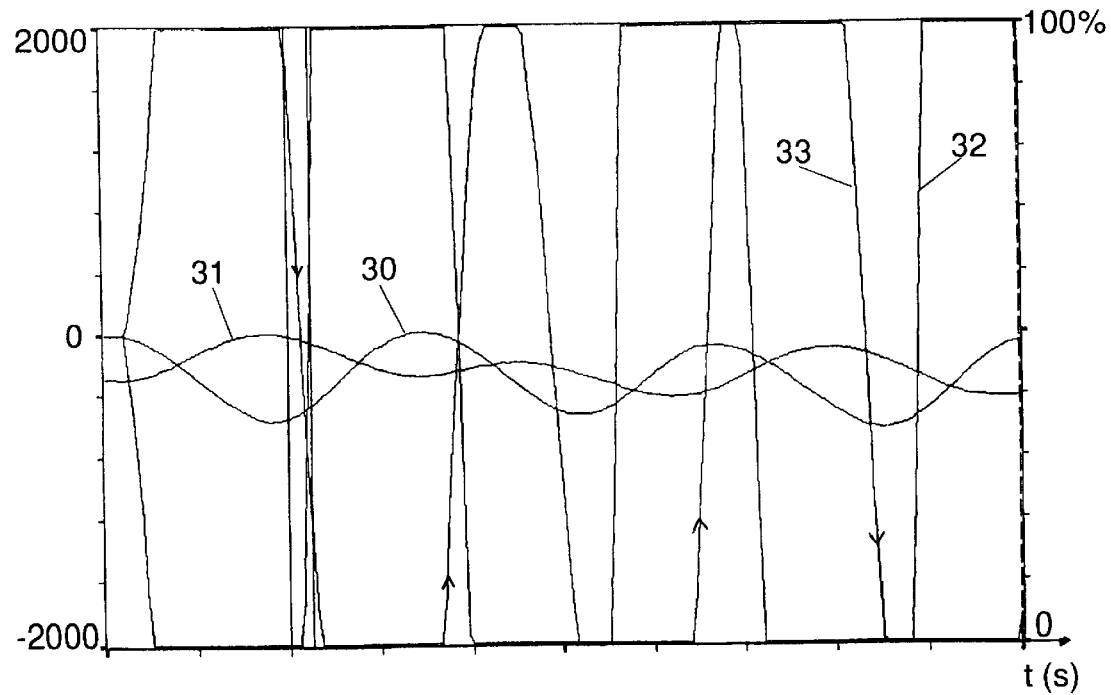
FIG. 5 shows the plot of signals displayed by the EPD controller monitoring step C of the "AB ETCH" process in the same chamber when the structure is without defect and when the etch process of step C is performed correctly.
Figure 8:
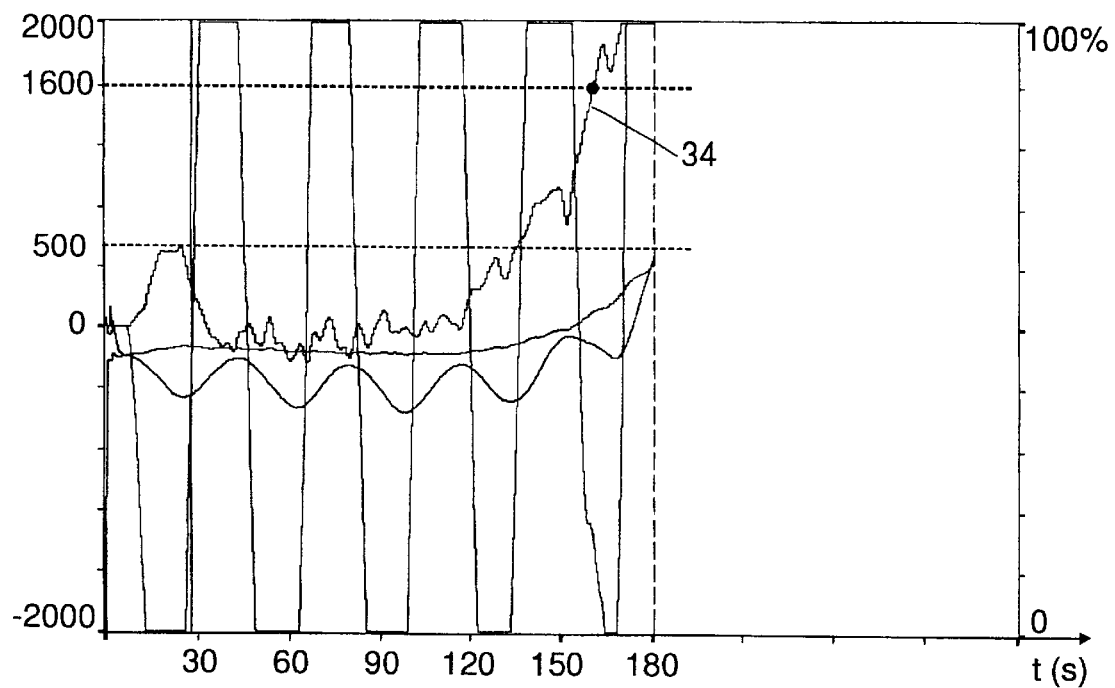
FIG. 8 shows the plot of signals displayed by an EPD controller monitoring step A of the "AB ETCH" process when the structure enters step A with the AB1 photoresist layer missing.

As mentioned above, at the initial stage of the "AB ETCH" process, i.e. step A, photoresist layer AB1 is normally present. The case where structure 19 has no defect is represented by curves 26 to 29 in the graph of FIG. 4. As apparent from FIG. 4, the derivative signal S'1 (curve 27) exhibits a very sharp transient at the end of the step. Now turning to FIG. 8 which illustrates the signals 31, S'1, S2 and S'2 when the AB1 photoresist layer 24 is missing. In this case, the S'1 signal represented by curve 34 has a more gradual slope instead. This difference will be used by the expert information to distinguish the two cases. To characterize the absence of the AB1 photoresist layer, the following rule has been established: if signal S'1 is higher than 500 (arbitrary units) and lower than 1600 during at least about 25 s, the AB1 photoresist layer is considered missing. Then, the consequence of such a situation is considered for an appropriate response. If AB1 photoresist layer is missing and step A performed as usual, during steps B and C, the totality of the TEOS SiO2 layer 22 will be etched leading to a major cause of rejection. Therefore, as soon as the AB1 photoresist layer is detected "missing" the etching must be immediately stopped, so that in this case, the alert code is "IMMEDIATE STEP STOP" and the recommended action is to by-pass steps B and C in chamber 11-1. In this case, the wafer is reworkable.

EXAMPLE II

Figure 9:
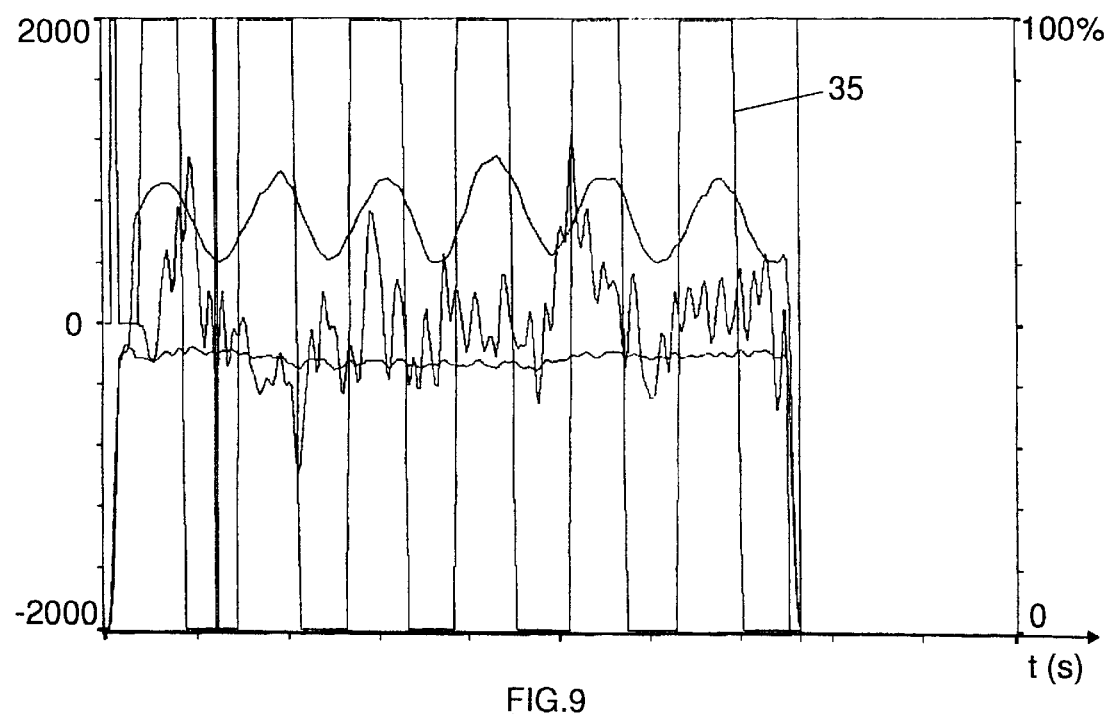
FIG. 9 shows the plot of signals displayed by the EPD controller monitoring step A of the "AB ETCH" process when the AB1 photoresist layer has not been patterned by any lithographic step.

Let us assume that the wafer has not been submitted to the AB1 lithography step. As a result, the two photoresist AB1 and AB2 layers 24 and 25 are present in their totality at the surface of the structure 19 before the wafer is processed at step A. FIG. 9 shows signals S1, S'1, S2 and S'2 in that particular situation. In this case, expert information provides selected signal S'2 of curve 35 which defines the etch rate and thus the etched thickness. The rule specifies that if etched thickness exceeds 10% of the nominal value, the process should be stopped, otherwise it will continue until the maximum allowed time be reached. Because, the etch end point of step A will never occur, the TEOS SiO2 layer 22 will never be etched, this is why the etch process must thus stop without delay. The alert code will be again "IMMEDIATE STEP STOP" and the recommended action is to by-pass steps B and C. In the instant case, the wafer is not damaged, it just needs to be reworked.

EXAMPLE III

Figure 10:
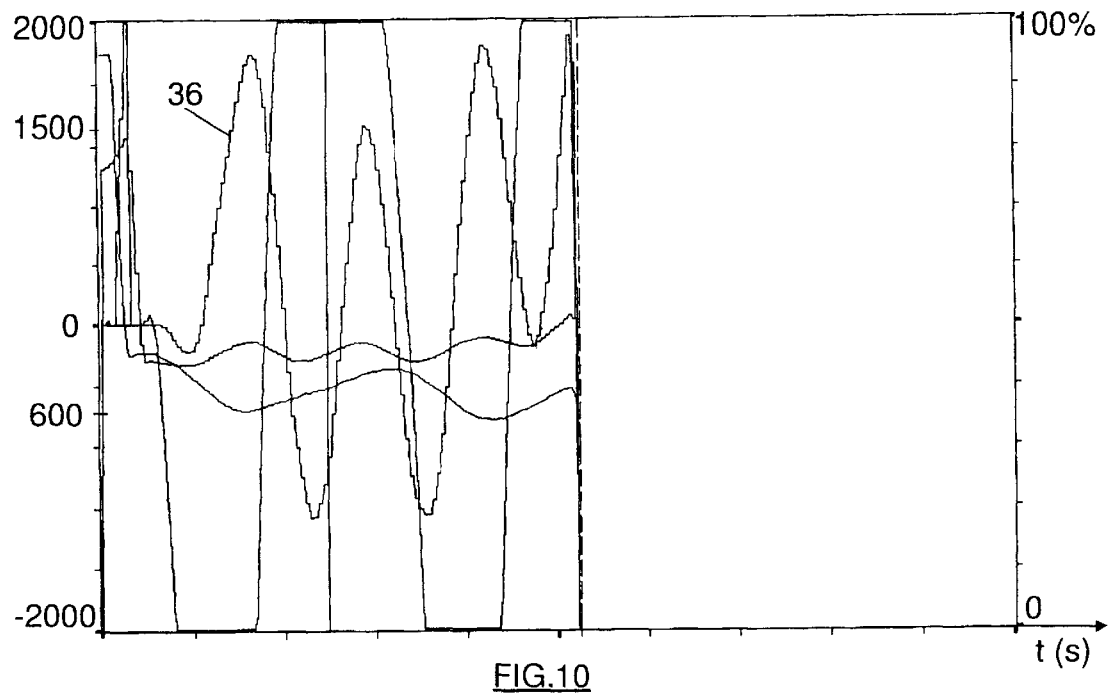
FIG. 10 shows the plot of signals displayed by an EPD controller monitoring step A of the "AB ETCH" process when the structure enters step A with the AB2 photoresist layer missing.

Still another frequent failure that occurs in the manufacturing at the "AB ETCH" level is the absence of the AB2 photoresist layer 25. If AB2 photoresist layer 25 is missing when step A is initiated in chamber 11-1, the chemistry that is currently used at this step, etches both the TEOS SiO2 material of layer 22 and the photoresist material of AB1 layer 24 at the same rate. In a few minutes, the totality of the AB1 photoresist is removed plus a large amount of the TEOS SiO2 material. As a consequence, the wafer needs to be rejected at this stage of the fabrication process. In this case, signal S'1 will be used, and as soon as an interference is detected, which means that TEOS SiO2 material is being etched, the etching is immediately stopped. FIG. 10 shows signals S1, S'1, S2 and S'2 in that particular situation, wherein signal S'1 is represented by curve 36. In this case, the rule is: starting from RATE TIME RT of signal S'1 for a maximum duration of 120 s, if signal S'1 amplitude raises above 1500 (arbitrary unit) and decreases below 600 and then raises again above 1500, this means that the etch rate is too high. The alert code is "IMMEDIATE TOOL STOP" and the recommended action is thus to stop the plasma etcher tool. In this particular case, all the remaining wafers of the lot undergoing processing are visually controlled to check the presence of the AB2 photoresist layer 25.

EXAMPLE IV

Figure 11:
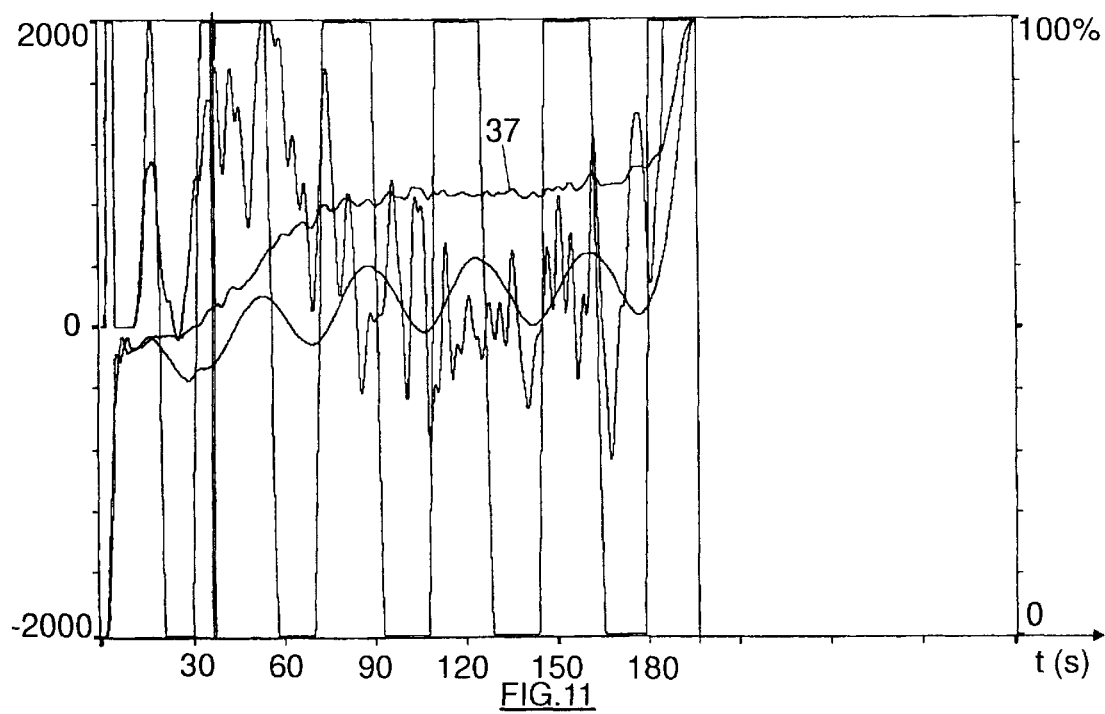
FIG. 11 shows the plot of signals displayed by the EPD controller monitoring step A of the "AB ETCH" process when there is an undesired polymer deposition onto the plasma etcher chamber view port.

This example relates to a tool misfunction. It happens sometimes that the chamber inner walls are covered with by-products (typically polymers) of the chemical reaction produced by the etching. When step A is initiated, these by-products are etched first, so that the planned etch time defined to fully remove the AD2 photoresist layer 25 reveals to be not sufficient and at the end of step A, the wafer comes out of chamber 11-1 still with an AB2 photoresist coating. The alert code will indicate to the computer that a further etch is necessary. The criteria developed by the expert information may be understood in conjunction with FIG. 11. FIG. 11 shows signals S1, S'1, S2 and S'2 corresponding to that situation. The test will be performed on the amplitude of signal S1 represented by curve 37. Two tests are performed at an interval of 60 s, and if the difference in the signal amplitude is greater than 10%, the alert code will indicate that an additional etch of a determined duration must take place.

EXAMPLE V

Figure 12:
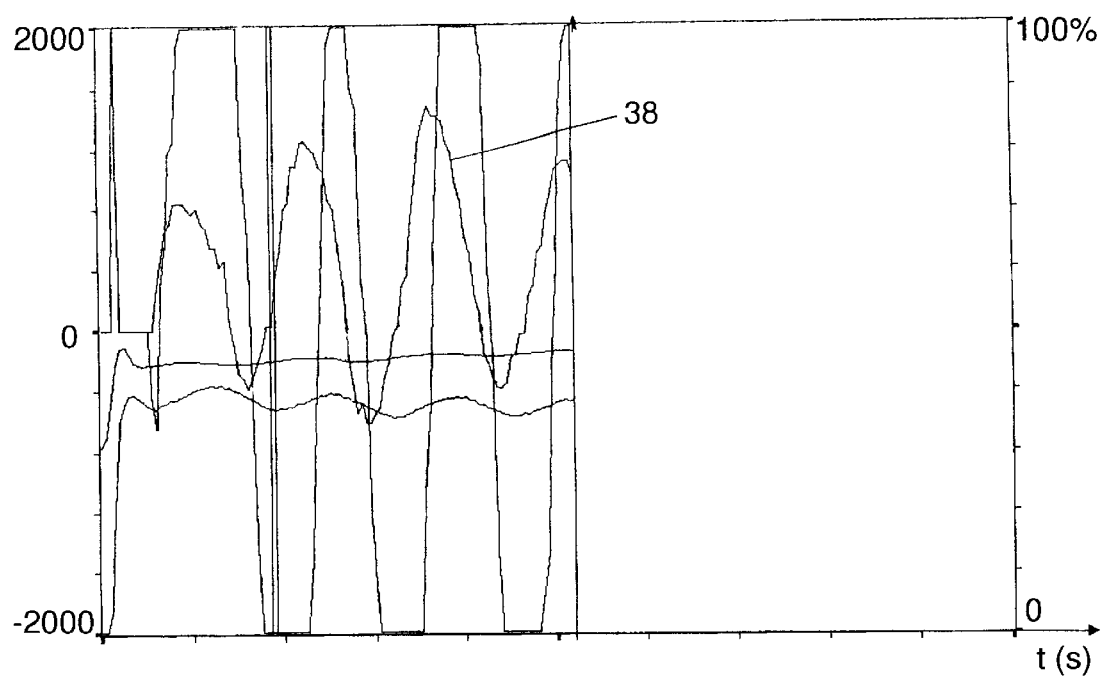
FIG. 12 shows the plot of signals displayed by an EPD controller 14-2 monitoring step C of the "AB ETCH" process when the structure enters step C with a photoresist drop in the middle of the wafer.

During the AB1 or AB2 photoresist deposition, a drop of resist often falls at the center of the wafer forming a local thickness increase. When the wafer will enter in step C, this defect inhibits the etch end point detection so that the wafer is etched the maximum allowed etch time. FIG. 12 shows signals S3, S'3, S4 and S'4 corresponding to that situation. In this case, the rule specifies that if an asymmetry is detected in signal S'3 represented by curve 38, an alert code "STOP AT DEFAULT TIME" is flagged. The recommended action will be to continue the etching during a pre-determined time (default time).

EXAMPLE VI

Figure 13:
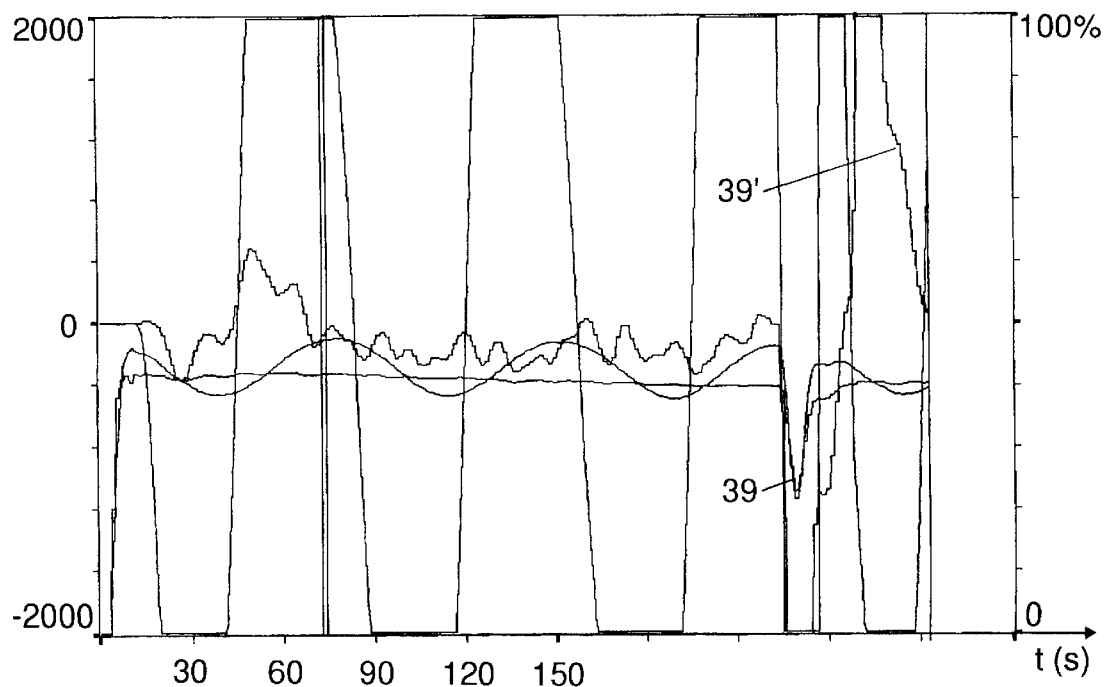
FIG. 13 shows the plot of signals displayed by the EPD controller 14-1 monitoring step A of the "AB ETCH" process when there is a RF shut-down of the plasma etcher during the etch process.

When the RF generator stops and restarts immediately, e.g. during step A, the S1 signal falls and rises again. Its derivative signal S'1 goes more abruptly the same way. The surge that is generated causes a false etch end point so that step A is stopped too early. Next, the wafer is processed according to step B. Finally, when the wafer is submitted to step C, a large amount of photoresist AB2 still remain atop the wafer. The step C chemistry being selective, will not etch the TEOS SiO2 material. As a final consequence, if no alarm is flagged during step A, the wafer will exit the step C with an un-attacked TEOS SiO2 layer 22 and it will be rejected after the chem-mech planarization step. FIG. 13 shows signals S1, S'1, S2 and S'2 corresponding to that situation. The curves representing signal S1 and S'1 are referenced 39 and 39' respectively. In this case, the rule defined by the process engineers is: thirty seconds after step A is started, checks signal S1 amplitude, if the variation between two samplings is greater than 5%, an alert code of "IMMEDIATE STEP STOP" should be flagged. The recommended action will still be to by-pass the B and C steps.

Figure 14:
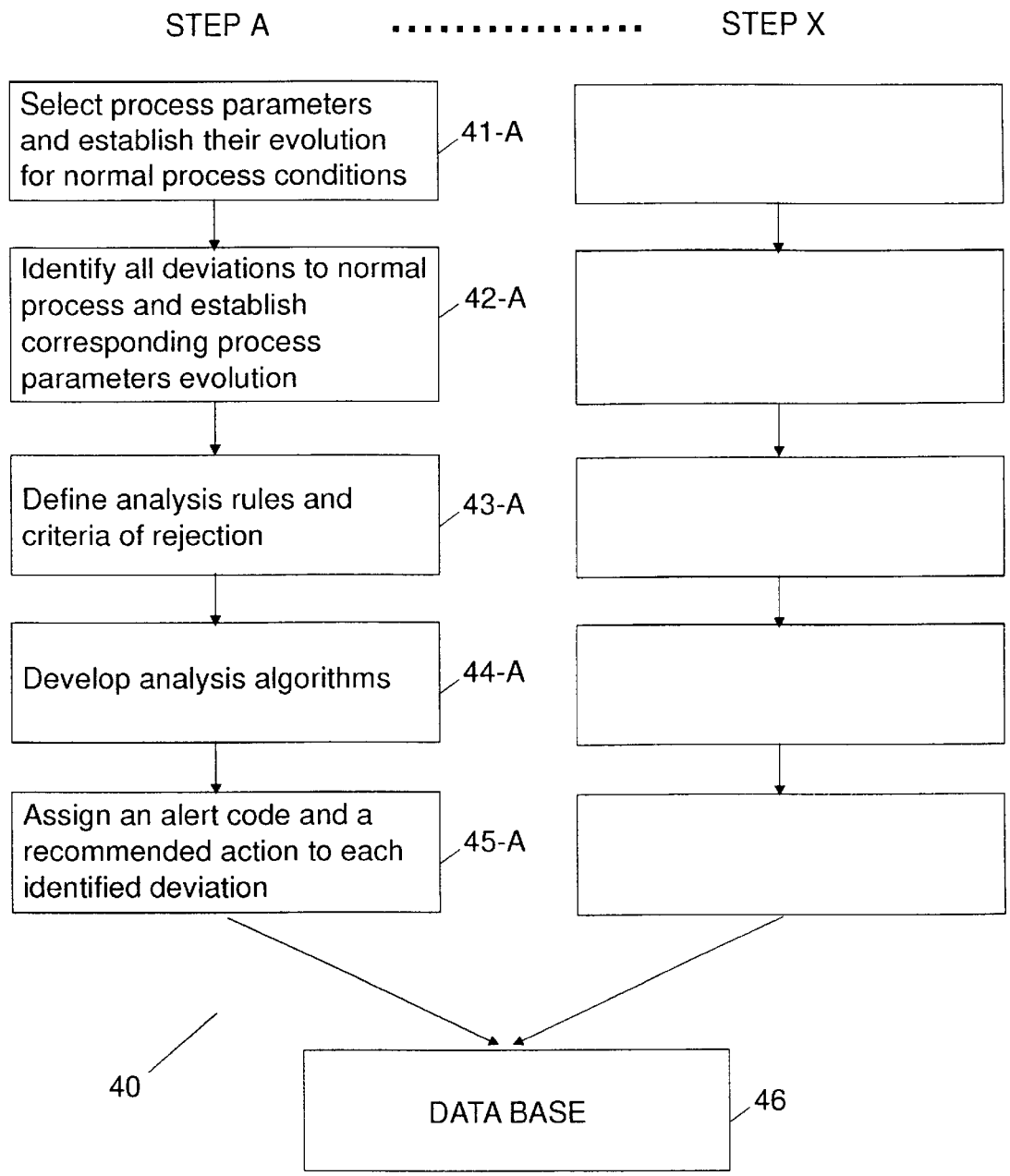
FIG. 14 shows the flow chart that summarizes the different steps to create the database according to the method of the present invention.

The different operations that lead to the construction "alarm" component of the database are schematically summarized by the flow chart referenced 40 in FIG. 14. Let us consider the sequence of operations for the first processing step labelled A of a global process which includes a number of steps labelled A to X. Now turning to FIG. 14, the first operation consists to select the right process parameters to monitor step A and establish their evolution during a processing conducted in normal conditions (box 41-A). The evolution of these selected process parameters will be used, as a reference, to supervise the process in-line and in real-time. In this particular case of the "AB ETCH" process, these selected process parameters, at least includes the four signals 91, S'1, S2 and S'2 depicted in FIG. 4. Next, all the possible deviations with respect to normal process conditions are identified and the evolution of said selected process parameters is established for each deviation (box 42-A). Moreover, still for each deviation, analysis rules, including criteria of rejection, are defined to characterize this particular situation (box 43-A). Note that, if several process parameters are used, the supervisor will analyze them in parallel. Then, specific analysis algorithms are developed (box 44-A). As a matter of fact, there is a specific set of algorithms adapted to each step. These algorithms are developed by the expert information. An alert code and the recommended action to be taken are assigned to any identified deviation (box 45-A). Finally, this sequence of operations is performed for each step A to X of the global process. All these alarm related data are stored in a database labelled DATABASE in box 46 of FIG. 14. This database, referred to as database 46 hereinbelow, is preferably lodged in supervisor 35, although an external database could be envisioned as well. Database 46 thus includes all the pertinent "alarm" related. In other words, it includes the evolution of the selected process parameters in normal operating conditions and in the identified deviations thereof, the analysis rules with their associated rejection criteria (formulated in the form of analysis algorithms) and finally, the alert codes and the actions to be undertaken that are assigned to each deviation. Because of the obvious flexibility of the above described procedure, the "alarm" component of database 46 may be thus adapted to one or several steps of the wafer fabrication process and to one or several tools of the manufacturing line.

Novel Process Flow

The novel process flow will be described by reference to FIG. 15 where it bears numeral 47. It is thus applicable to any processing step and to any tool of the wafer fabrication process. For a determined processing step, the wafer is loaded in the specified chamber of the tool (step 48). Then, computer 12 down-loads: the batch (or lot) name, the process name, the step name and the wafer ID (identification number) in the supervisor 35. Note that the batch and process names are only loaded at the first step of the process and the wafer ID is loaded at each wafer change and for each step. According to an important feature of the present invention, a measurement is performed, if so required, at this stage of the processing step (step 49). It is performed in-situ by internal measurement unit (e.g. 17'-1 in FIG. 7) lodged in the EPD controller (e.g. 14-1). However, as apparent in FIG. 15, a variant consists to perform this measurement step 49 before loading the wafer in the tool chamber. In this case, it is conducted in measurement unit 17" lodged in tool 11. Upon receipt of the measurement results, the supervisor 35 stores the measurement result in database 46 either for immediate or subsequent exploitation. Supervisor 35 may either use the measurement result or instead retrieve corresponding measurement data that were previously stored in database 46 to up-date (i.e. to change one or several process parameters for the said processing step (box 50). As apparent in FIG. 15, this data exchange with database 46 that is possible at step 50 denotes clearly the interactive aspect of the method of the present invention. Now, the processing (e.g. etching, deposition, . . . and the like) of the wafer is initiated for this step in consideration and the EPD controller (and/or any control device) that monitors this particular step is activated (step 51). Simultaneously, the supervisor 35 starts the analysis of the selected process parameters by applying the adequate algorithms stored in the database to analyze the corresponding signals generated by the EPD controller according to the analysis rules stored in the database (step 52). As a result, the evolution of the selected process parameters is permanently analyzed. Upon occurrence of any selected process parameter drift, the supervisor 35 tests if any of the rejection criteria set up by the process engineers is met (step 53). It is the role of the analysis algorithms to recognize any identified deviation to the normal process. The analysis and the test are thus performed in-situ and in real-time. If an anomaly (i.e. a deviation) is detected, supervisor 35 provides an alert code to the computer 12, so that the adequate action can be immediately taken (step 54). If none anomaly has been detected by the supervisor 35, the step in consideration is continued until end (step 55). The results of the measurement performed in step 49 (if any), the process parameters that are essential for this step and the evolutions of the selected process parameters which monitor this step constitute the so-called "step report" for that determined step and the wafer in consideration. The alert code and the action to be taken constitute the so-called "alarm report" (step 56). The step and alarm reports are stored in the database 46 in a file referred to as the "wafer history" as it will be explained in more details later on. Finally, the wafer is then ready to go to the next step (step 57).

Figure 16:
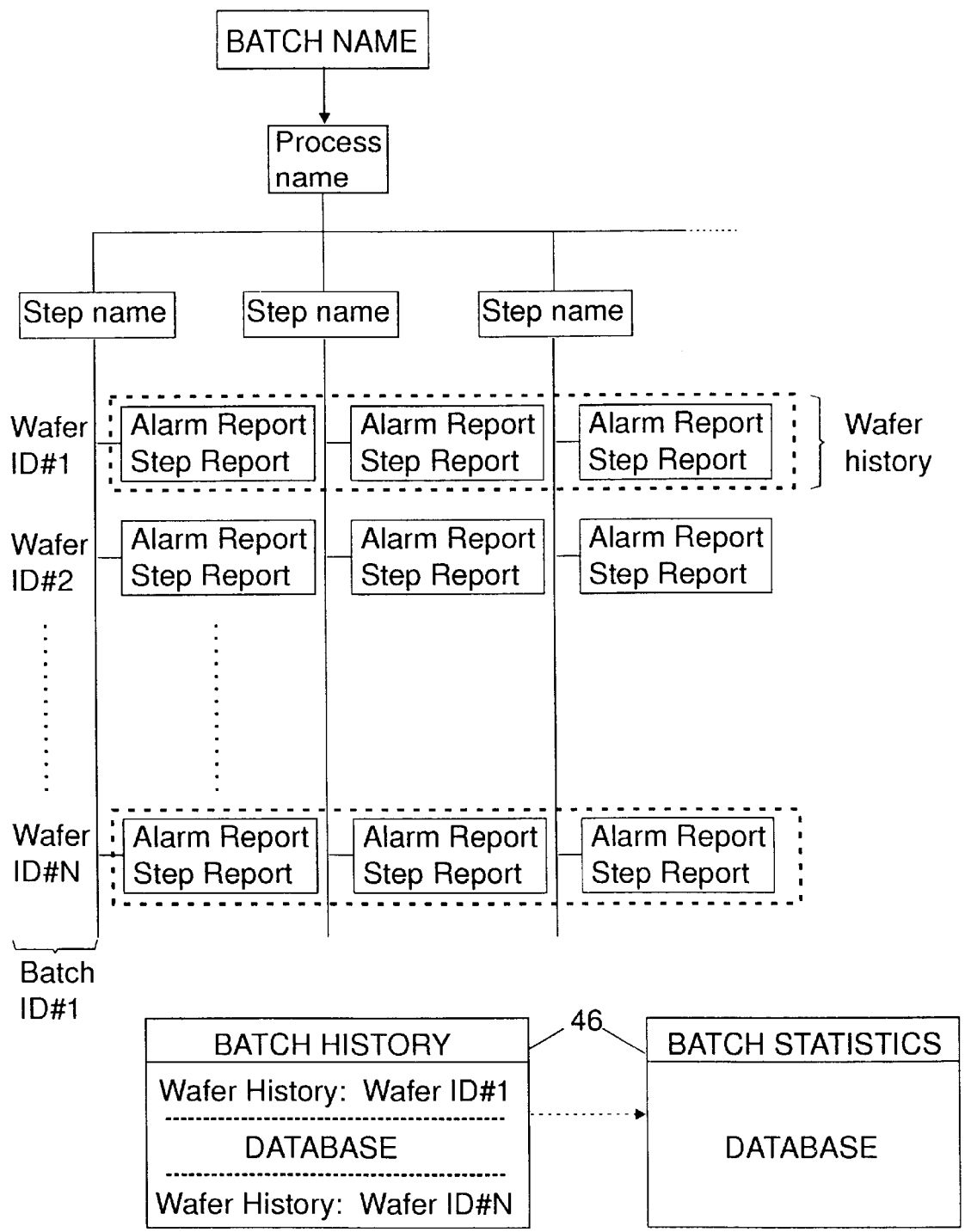
FIG. 16 schematically shows the flow chart that summarizes the construction of a wafer history from the set of step reports and of the batch history formed by the juxtaposition of the wafer history of each wafer of the batch.

FIG. 16 depicts flow chart referenced 58 which summarizes at a high level the construction of the wafer history for each wafer of the batch. As apparent in FIG. 16, the wafer history is thus, for a wafer identified by its ID, the sum of all the step/alarm reports established for every step of a determined process. In turn, the sum of all the "wafer history" of the wafers of the batch constitute a second component of database 46, referred to as the "batch history". Other components of database 46 may be envisioned as well. For instance, some data of the batch history file may be processed for special purposes to provide batch statistics as shown in FIG. 16 by a third component of database 46 referred to as "batch statistics". For instance, the batch statistics component may include the average value of the etch rates that have been measured for all the wafers of the batch at a determined step. In summary, the database 46 is typically comprised of three components: two are specifically related to the wafer: the "alarm" and "wafer history" and the third one is related to all the wafers of a batch: the "batch statistics". The batch history is formed by the juxtaposition of the "wafer history" of all the wafers of the batch.

Figure 15:
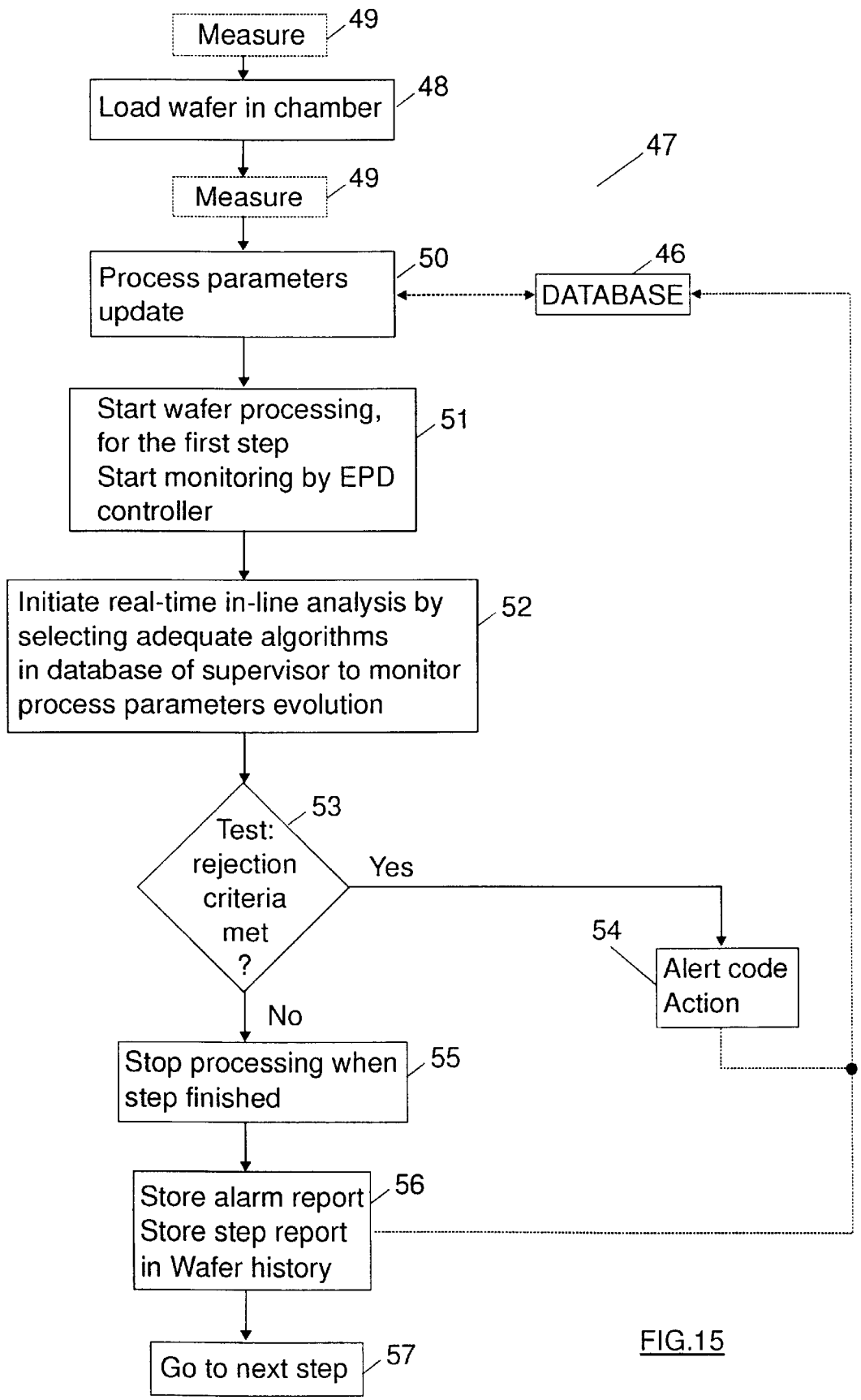
FIG. 15 shows the flow chart that summarizes the essential steps involved in the real-time in-situ novel process flow according to the method of the present invention when applied to any processing step of the wafer fabrication process.

Let consider now, the reduction to practice of the novel process flow 47 of FIG. 15, when applied to the "AB ETCH/AB STRIP" process.

When the wafer enters in chamber 11-1, the batch name (e.g. batch ID#1), the process name (e.g. "AB ETCH") and the step name (e.g. A) have been already sent to supervisor 35 by computer 12 and optionally, a part of this information can be sent to EPD controller 14-1 thru bus 18 if there is some intelligence therein. Note that, at this stage of the process, a measurement step can be conducted by internal measurement unit 17'-1, for instance, to determine the thickness of the dual AB1/AB2 photoresist layer. If this measurement is performed, the measured value is stored in the step A report. Note also, that some step A process parameters can be up-dated through this measurement step (or a previous measurement step) before step A starts. Now, the wafer ID is sent to supervisor 35 and step A process starts, so does EPD controller 14-1 to generate signals S1, S'1, S2 and S'2, that are immediately processed by the specific analysis algorithms (selected as soon as the step name is down-loaded in the supervisor 35). If an anomaly is detected during the test, depending upon the identified deviation, the corresponding alert code is sent to computer 12 to take the appropriate action. A typical action is to by-pass the remaining steps B and C. However, depending upon the seriousness of the deviation, either the process or the tool can be stopped. If no anomaly is detected, the wafer is processed until step A termination. Some process parameters and the evolutions of the selected process parameters for this step (if of importance for the subsequent steps) and the alert code are stored in two different files labelled step report and alarm report (could be merged in a single file).

Then, wafer enters step B. Step B name is sent to supervisor 35 by computer 12. Step B is not monitored by EPD controller 14-1 unlike step A, its duration is determined by a fixed time. However, supervisor 35 may analyze other signals, such as the signal related to the occurrence of a possible general failure (e.g. a RF shut-down). If no anomaly is detected, no alarm is flagged. At the end of the step B process, the step and alarm reports for step B are stored in database 46. Before the wafer enters step C, a measurement step can be performed by internal measurement unit 17'-1 of EPD controller 14-1. The role of this step is to check whether or not the thickness of the TEOS SiO2 layer 22 is still within specifications. This thickness is a good example of a process parameter that is stored in the step report. If the thickness is within the specifications, the wafer enters in step C.

Supervisor 35 retrieves from the batch statistics file, the average etch rate such as determined by the similar measurements conducted with the prior processed wafers (starting from a default value). Supervisor 35 is then able to compute an accurate etch time for step C that is admittedly very close to the ideal duration to etch the TEOS SiO2 layer 22. Step C process is now conducted to its end. Likewise, at the end of step C, the step and alarm reports are stored in the wafer history file of that wafer in consideration in database 46 for up-date. As a consequence, the batch history file, and in turn, the batch statistics file are also up-dated to take into account the value of the etch rate that has been really measured during step C to smooth the average value of this process parameter therein. Processing the wafer in chamber 11-1 is now finished.

Wafer is directly transferred to chamber 11-2 to perform step A of the "AB STRIP" process. However, a measurement can be performed in measurement unit 17" in-between. When step C is completed, the step report and the alarm report (if any) are stored, so that the wafer history of this wafer is now complete for the "AB ETCH/AB STRIP" process. If no alarm has been flagged during the process, this means that all the wafers of the lot are good. On the contrary, if an alarm has been flagged, the failed wafer can now be identified by its wafer ID and the cause of the failure can be found in the step and alarm reports. So that no wafer characterization is necessary at the end of the "AB ETCH/AB STRIP" process.

The above step sequence for a correctly processed wafer may be schematically summarized as follows.
1) Unload wafer from cassette and load wafer in chamber 11-1.
2) Run the three steps A to C of the "AB ETCH" process and step A of the "AB STRIP" process in sequence, except if an alarm is flagged. In this case, the next steps are generally by-passed, although sometimes the process or the tool chamber can be stopped.
3) Unload wafer from tool and load in cassette.
4) Go to the next process.

Figure 6:
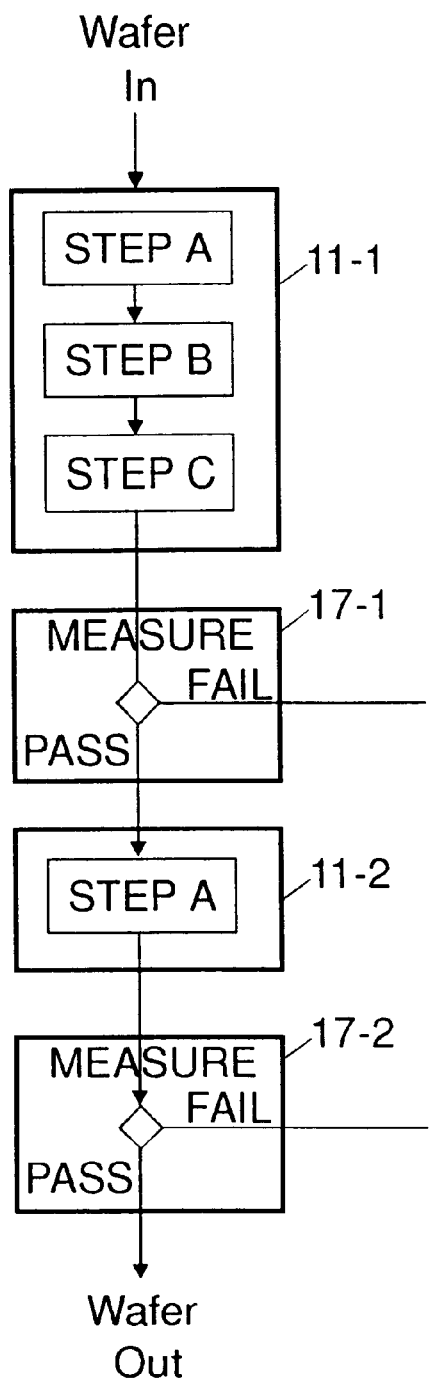
FIG. 6 shows the flow chart of the "AB ETCH/AB STRIP" process when conducted with the FIG. 2 system when the process tool is a plasma etcher.
Figure 17:
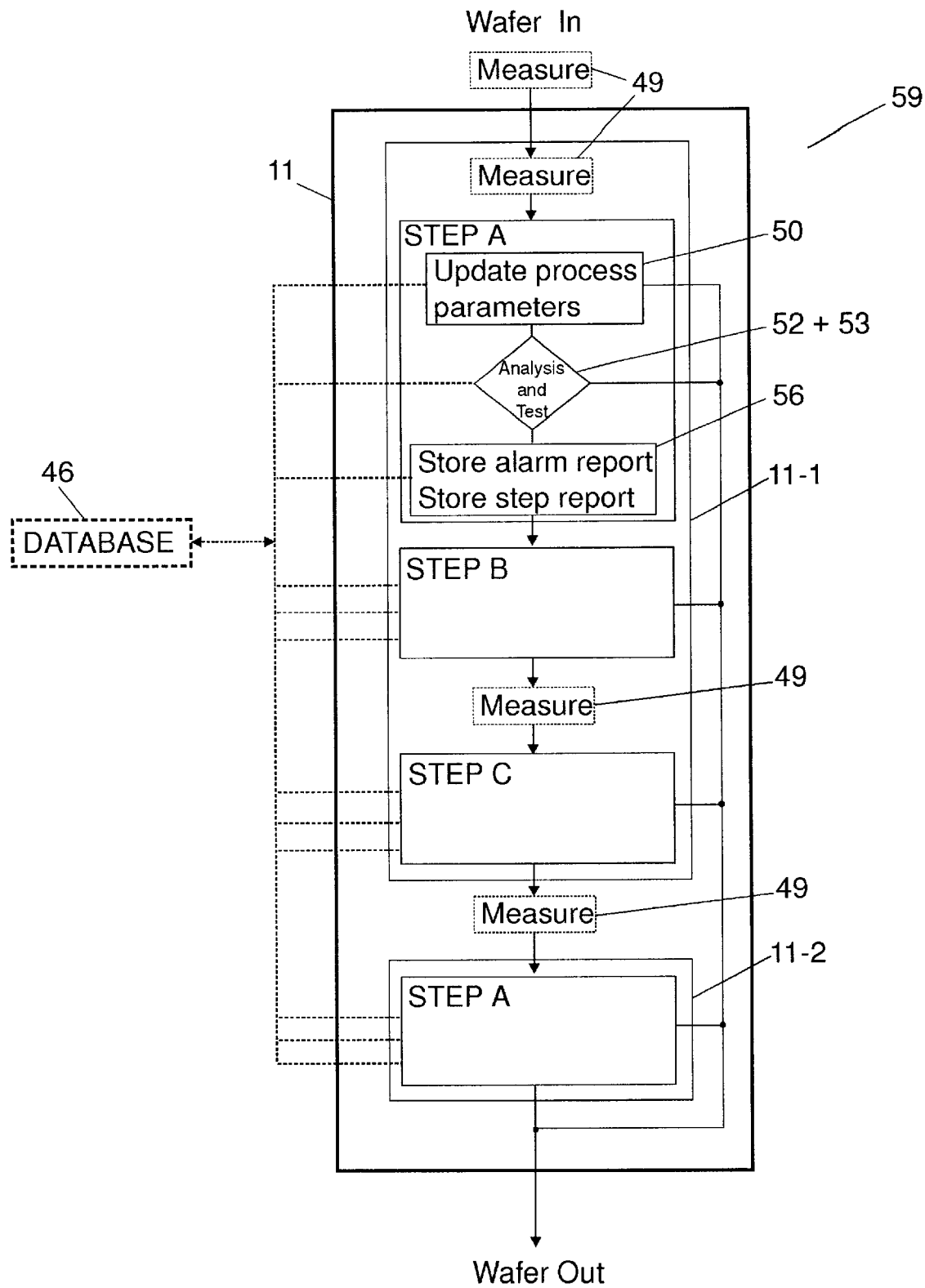
FIG. 17 shows the flow chart of the "AB ETCH/AB STRIP" process when conducted with the FIG. 7 system of the present invention.

The flow chart 59 depicted in FIG. 17 summarizes the above description relative to the "AB ETCH/AB STRIP" process and further allows a pertinent comparison with the chart shown in FIG. 6. As apparent in FIG. 17, measurement steps that were externally performed in measurement units 17-1 (TEOS SiO2 layer 22 thickness) and 17-2 (batch characterization) are no longer necessary. Because the wafer does not need to be checked in measurement unit 17-1 before it is sent to chamber 11-2, the "AB ETCH/AB STRIP" process is fully clusterized, i.e. a direct transfer between chambers 11-1 and 11-2 is now possible, and all the steps thereof are performed in tool 11.

Figure 18:
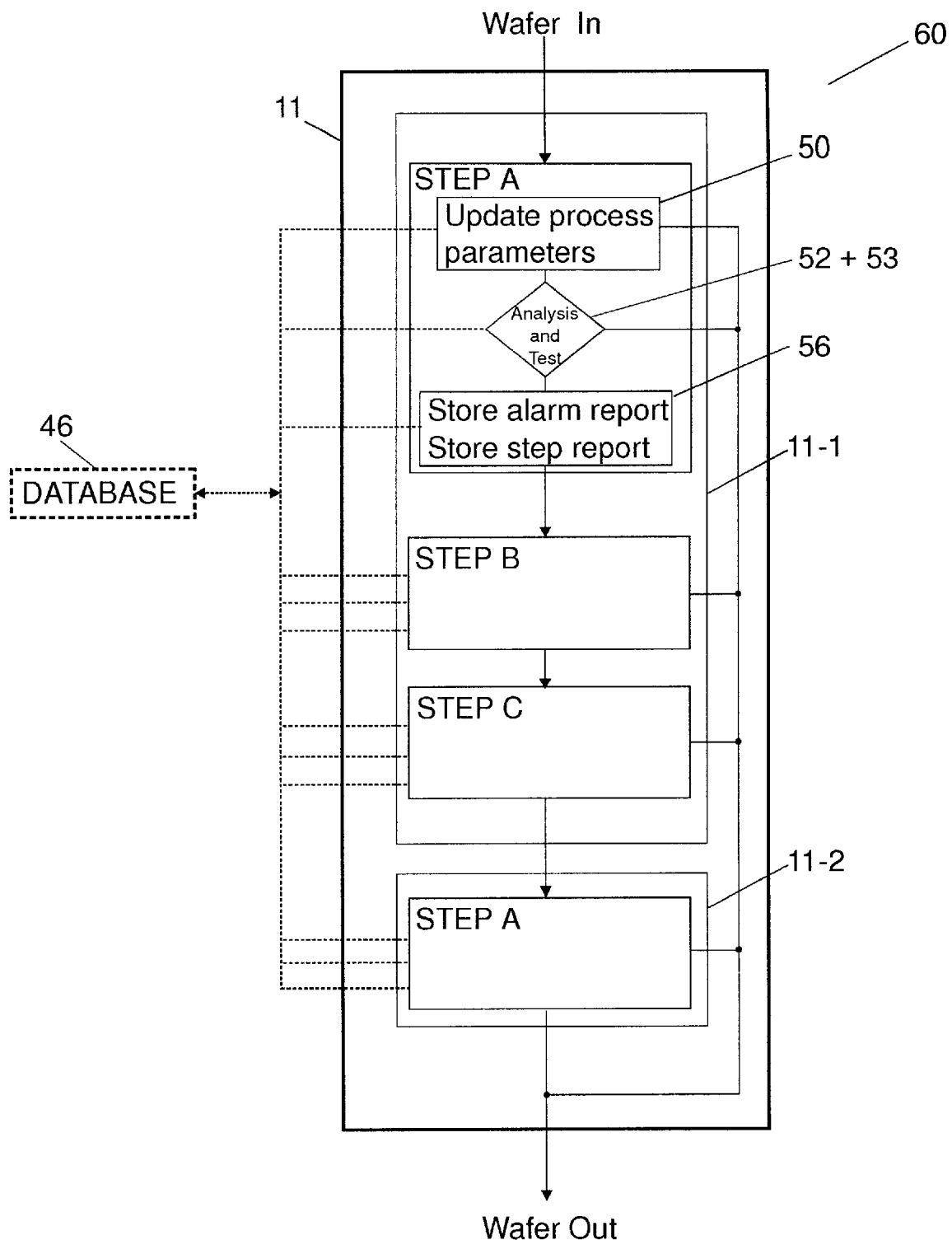
FIG. 18 shows a variant of the FIG. 17 flow chart still according to the present invention.

Flow chart referenced 60 in FIG. 18 shows a variant of flow chart 59 depicted in FIG. 17, in that there is no longer any measurement (of the type labelled 49 in FIG. 17) performed by the measurement units 17'-1 and 17" in the course of the "AB ETCH/AB STRIP" process flow. In this case, the measurement results are indirectly obtained from the processing of the above mentioned selected process parameters. However, the database operates with the store (for up-date of the wafer history) and retrieve steps as described above. For instance, step B of the "AB ETCH" process such as described above can be conducted differently. Normally, the etching of the TEOS SiO2 and AB1 photoresist layers is performed for a duration that is determined by a fixed time. Instead, this duration may be extrapolated from the etch rate value of the AB2 photoresist layer 25 such as determined in step A through the monitoring of signal S'2 (see curve 29 in FIG. 4), that was stored in the step report thereof. In this case, this etch rate value is thus retrieved from the database 46 to up-date the etch time that is necessary to etch the TEOS SiO2 and AB1 photoresist materials before step B starts. This is possible because the etch mixture that is used in step B has no noticeable selectivity between the materials of the AB1/AB2 photoresist and TEOS SiO2 layers.

Finally, the supervisor 35 that fully controls all the steps of the "AB ETCH/AB STRIP" process, through EPD controllers 14-1 and 14-2 now guarantees that only good wafers will be completely processed. Moreover, the method and system of the present invention allows a total clusterized (i.e. in-situ) "AB ETCH/AB STRIP" process. Finally, failed wafers can now be immediately identified at the tool output by their identification number (wafer ID). Finally, some components of the database (e.g. batch history and batch statistics files) may reveal to be of great value for other processes or in other locations of the manufacturing line. For instance, the exploitation of data related to the set of "batch history" of good wafers provide interesting information as to the evolution of operating characteristics of the process tool, allowing thereby to develop the predictive maintenance of the process tool and to change some process parameters thereof to correct some drifts that could occur during a long period in the manufacturing line. The study of a specific process parameter through a number of "batch history", for instance the etch rate at a determined step of the wafer processing, could reveal to be an important data of the "batch statistics" file for the same reasons. Finally, the exploitation of the data related to the "wafer/batch history" of bad wafers is also of great value, for instance for reworkable wafers.

What is claimed is:

1. In a method for real-time in-situ interactive supervision of a particular step of a process for fabricating a semiconductor wafer belonging to a batch of wafers comprising the steps of:

a) selecting at least one process parameter that is determining for the monitoring of the particular step;
   b) establishing a database including:
      a first file referred to as an "alarm" component of the database which contains in coded form:
         an evolution of said selected process parameter in normal operating conditions and in all deviations thereof based on expert information;
         algorithms representative of analysis rules adapted to recognize any such deviation which include rejection criteria for each deviation; and,
         an alert code for each case of deviation;
      a second file referred to as a "wafer history" component of the database which contains in coded form a history of the wafer until the particular step with a reference to the batch, the process and step names for the particular step and an identification number of the wafer in consideration; wherein said wafer history includes important process parameters and the evolution of said selected process parameter for the previous process steps for the wafer in consideration;
   c) providing process elements including:
      a tool having at least one chamber for processing the wafer at said particular step of the fabrication process;
      a tool computer to control physical process parameters of the tool;
      at least one monitoring equipment to monitor at least one selected process parameter that is determining for said step;
      at least one measurement unit internally mounted in the monitoring equipment and/or in the process tool that is capable to perform in-situ process parameter measurements;
      a supervisor that is connected through a network to said tool computer, said monitoring equipment, said measurement unit and said database to supervise the process flow for said determined step;
   d) introducing the wafer in the tool chamber;
   e) in-situ measuring a determined process parameter with said measurement unit to obtain a measurement value, the value being stored in the database for immediate or subsequent use;
   f) retrieving the value from the database for immediate exploitation in said determined step to up-date at least one process parameter to change operating conditions thereof;
   g) starting wafer processing;
   h) analyzing the evolution of said selected process parameter by the supervisor for comparison with corresponding data stored in the database to detect in real-time in-situ any deviation that could occur during said particular step;
   i) continuing wafer processing to normal end if no deviation is detected, or taking a corrective action as initiated by the supervisor if a deviation is detected, wherein the supervisor provides the alert code corresponding to the detected deviation; and,
   j) storing all data that are representative of the processing for said determined step in a "step report" and any alert code in an "alarm report" to up-date the wafer history file of the wafer in consideration.

2. The method of claim 1 wherein all the steps c) to h) are repeated for all steps of the process and wherein all said step and alarm reports are stored in the database to constitute the "wafer history" of the wafer for the process in consideration.

3. The method of claim 2 wherein the "wafer history" for all wafers of the batch are grouped in the database to constitute a "batch history" file.

4. A system for processing a semiconductor wafer having real-time in-situ interactive supervision capabilities comprising:

a) a tool having at least one chamber to perform said wafer processing;
   b) a computer for controlling physical process parameters of the tool;
   c) a monitoring equipment for monitoring at least one selected process parameter of the process which takes place in the tool chamber;
   d) at least one measurement unit mounted internally in the monitoring equipment and/or in the process tool to perform in-situ process parameter measurements;
   e) a database which contains
      a first file referred to as an "alarm" component of the database which contains in coded form:
         an evolution of said selected process parameter in normal operating conditions and in all deviations thereof based on expert information;
         algorithms representative of analysis rules adapted to recognize any such deviation which include rejection criteria for each deviation; and,
         an alert code for each case of deviation;
      a second file referred to as a "wafer history" component of the database which contains in coded form a history of the wafer until the particular step with a reference to the batch, the process and step names for the particular step and an identification number of the wafer in consideration; wherein said wafer history includes important process parameters and the evolution of said selected process parameter for previous process steps for the wafer in consideration;
   f) a supervisor connected through a network to the monitoring equipment, the measurement unit, the tool computer and the database, wherein the supervisor is used for:

initiating an in-situ measurement in the measurement unit whenever required;

storing a result of the measurement in the wafer history file in the database;

retrieving the result of the measurement of the current step or the corresponding result of a previous step from the wafer history file;

analyzing the evolution of said selected process parameter during current wafer processing with corresponding data stored in the database to detect any deviation to normal operating conditions;

initiating a corrective action if a deviation is detected, wherein the supervisor provides the alert code corresponding to the detected deviation; and, storing all the data that are representative of the processing for the current step in a "step report" and any alert code in an "alarm report" to up-date the wafer history file of the wafer in consideration.

5. The system of claim 4 wherein said monitoring equipment is an EPD controller.

6. The method of claim 1, wherein in said analyzing step (h) the deviation comprises wafer misprocessing, process drift, or tool failure.

7. The method of claim 1, wherein in said taking a corrective action step (i) the supervisor provides the alert code to the tool computer.

* * * * *